(12) United States Patent
Lee

(10) Patent No.: US 9,576,846 B2
(45) Date of Patent: Feb. 21, 2017

(54) METHODS FOR MANUFACTURING A DATA STORAGE DEVICE

(71) Applicant: Kilho Lee, Suwon-si (KR)

(72) Inventor: Kilho Lee, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 314 days.

(21) Appl. No.: 14/226,770

(22) Filed: Mar. 26, 2014

(65) Prior Publication Data

US 2015/0017742 A1 Jan. 15, 2015

(30) Foreign Application Priority Data

Jul. 15, 2013 (KR) ........................ 10-2013-0082976

(51) Int. Cl.
*H01L 21/768* (2006.01)
*H01L 27/22* (2006.01)

(52) U.S. Cl.
CPC ....... *H01L 21/76816* (2013.01); *H01L 27/228* (2013.01)

(58) Field of Classification Search
CPC ............. H01L 21/76816; H01L 27/228; H01L 23/528; H01L 27/10888
USPC .......................................................... 438/3
See application file for complete search history.

(56) References Cited

U.S. PATENT DOCUMENTS

| | | | |
|---|---|---|---|
| 5,663,102 A | 9/1997 | Park | |
| 6,133,144 A | 10/2000 | Tsai et al. | |
| 6,821,879 B2 | 11/2004 | Wong | |
| 7,247,560 B1 | 7/2007 | Kinner et al. | |
| 7,531,448 B2 | 5/2009 | Wang | |
| 8,426,272 B2 | 4/2013 | Yoon et al. | |
| 2003/0003727 A1* | 1/2003 | Matsubara | ........ H01L 21/76802 438/672 |
| 2004/0087148 A1 | 5/2004 | Wong | |
| 2006/0014381 A1 | 1/2006 | Lee | |
| 2006/0292854 A1 | 12/2006 | Wang | |

(Continued)

FOREIGN PATENT DOCUMENTS

| | | |
|---|---|---|
| KR | 20100055137 A | 5/2010 |
| KR | 20100109173 A | 10/2010 |

(Continued)

OTHER PUBLICATIONS

Chris Ngai, "Manufacturing Ready Self-Aligned Double Patterning for 3xnm Flash Production", Dir of Process Engineering & Lithography Maydan Technology Center Group Applied Materials, Inc., May 13, 2008.

(Continued)

*Primary Examiner* — William F Kraig
*Assistant Examiner* — Pavel Ivanov
(74) *Attorney, Agent, or Firm* — Renaissance IP Law Group LLP

(57) ABSTRACT

Methods for manufacturing a data storage device are provided. A method may include forming an interlayer dielectric layer on a substrate, patterning the interlayer dielectric layer in a peripheral region of the substrate to form first trenches, forming first bit lines in the first trenches, patterning the interlayer dielectric layer between the first bit lines in the peripheral region to form second trenches extending along the first trenches after the formation of the first bit lines, and forming second bit lines in the second trenches.

20 Claims, 30 Drawing Sheets

(56) References Cited

U.S. PATENT DOCUMENTS

| | | | |
|---|---|---|---|
| 2007/0020829 A1 | 1/2007 | Hotta et al. | |
| 2008/0166851 A1 | 7/2008 | Hong et al. | |
| 2010/0015805 A1 | 1/2010 | Mayer et al. | |
| 2010/0136787 A1* | 6/2010 | Aritome | H01L 27/0207 438/670 |
| 2012/0021595 A1* | 1/2012 | Kim | H01L 23/5222 438/586 |
| 2012/0112362 A1* | 5/2012 | Shin | H01L 23/5226 257/774 |
| 2012/0149158 A1 | 6/2012 | Hong et al. | |
| 2012/0276729 A1 | 11/2012 | Yoon et al. | |

FOREIGN PATENT DOCUMENTS

| | | |
|---|---|---|
| KR | 20110082500 A | 7/2011 |
| KR | 20120024844 A | 3/2012 |
| KR | 20120064998 A | 6/2012 |

OTHER PUBLICATIONS

Jhin-Wei Chen, "Single Mask Dual Damascene Structure Fabrication Using Partial Transmission and Exposure Technique", Institute of Microelectronics Department of Electrical Engineering National Cheng Kung University Tainan, Taiwan, R.O.C. Thesis for Master of Science, Jun. 2007.

Y. Loquet et al., "56 nm pitch Cu dual-damascene interconnects with self-aligned via using negative-tone development Lithography-Etch-Lithography-Etch patterning scheme",Microelectronic Engineering (2012), pp. 138-144.

Y.K. Siew et al., "Enabling Interconnect Scaling with Spacer-Defined Double Patterning (SDDP)", Microelectronic Engineering (2013).

* cited by examiner

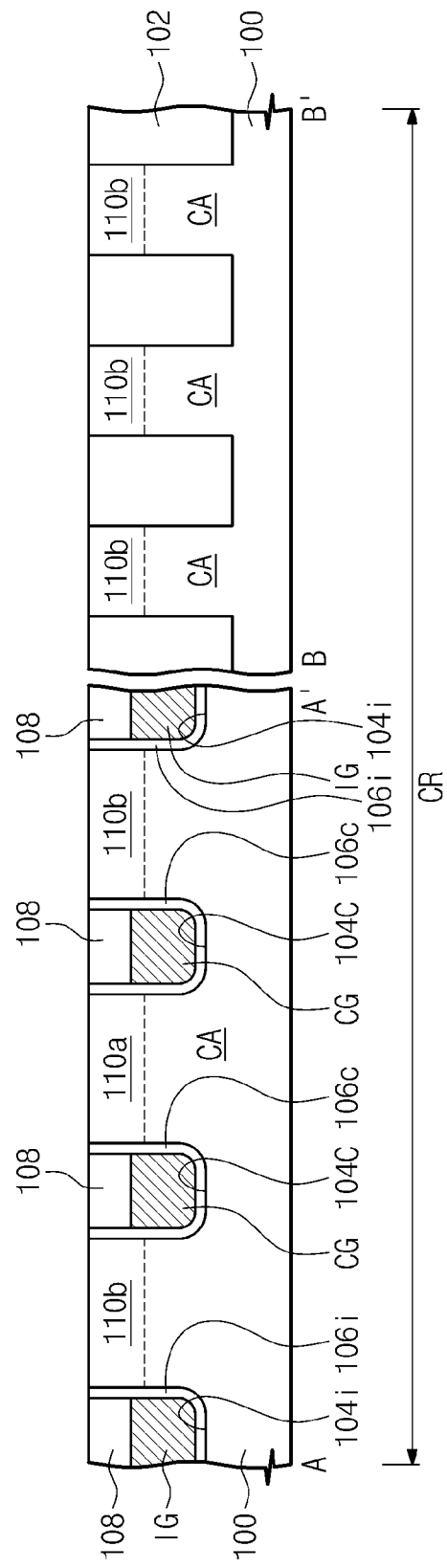

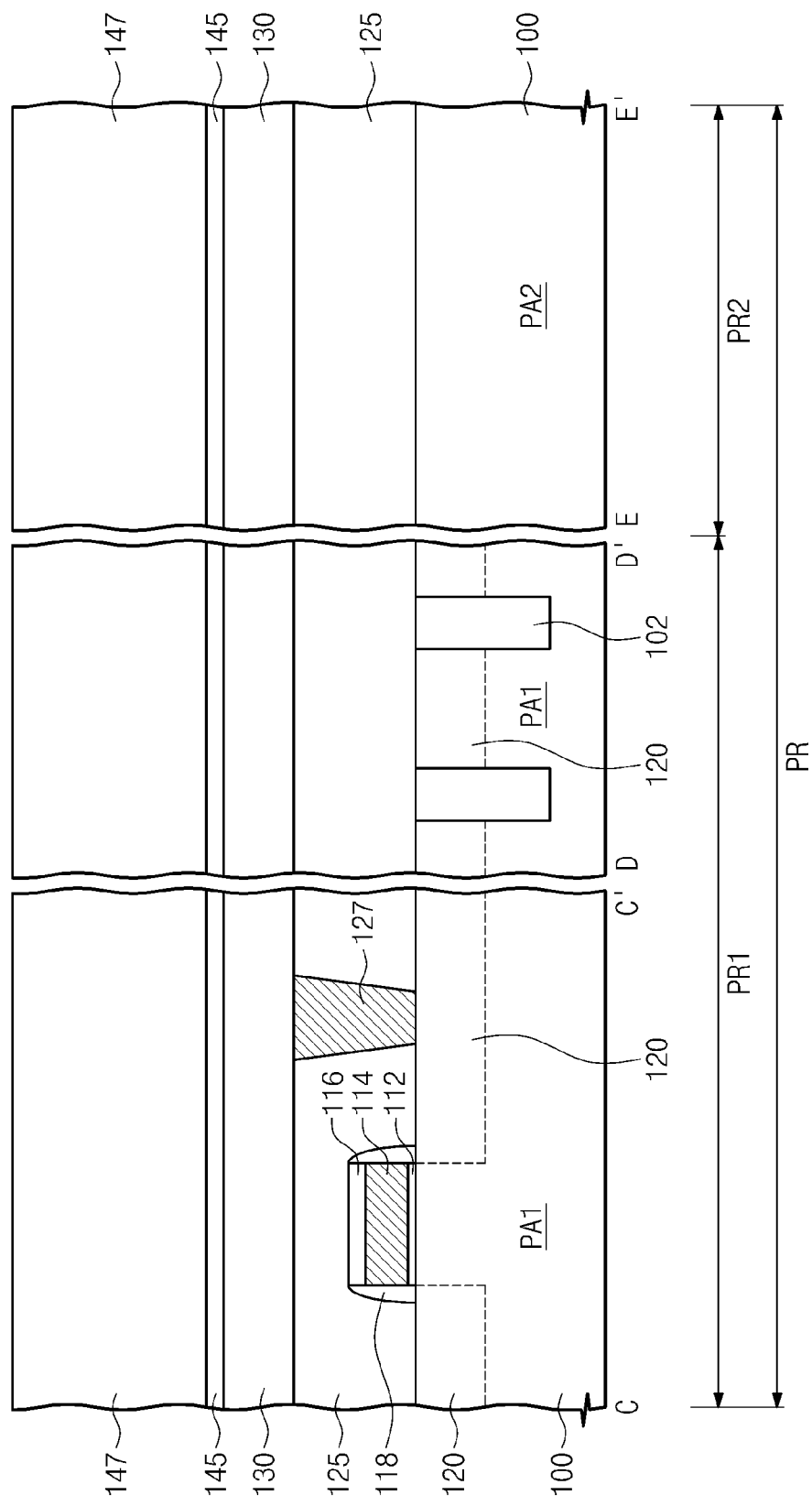

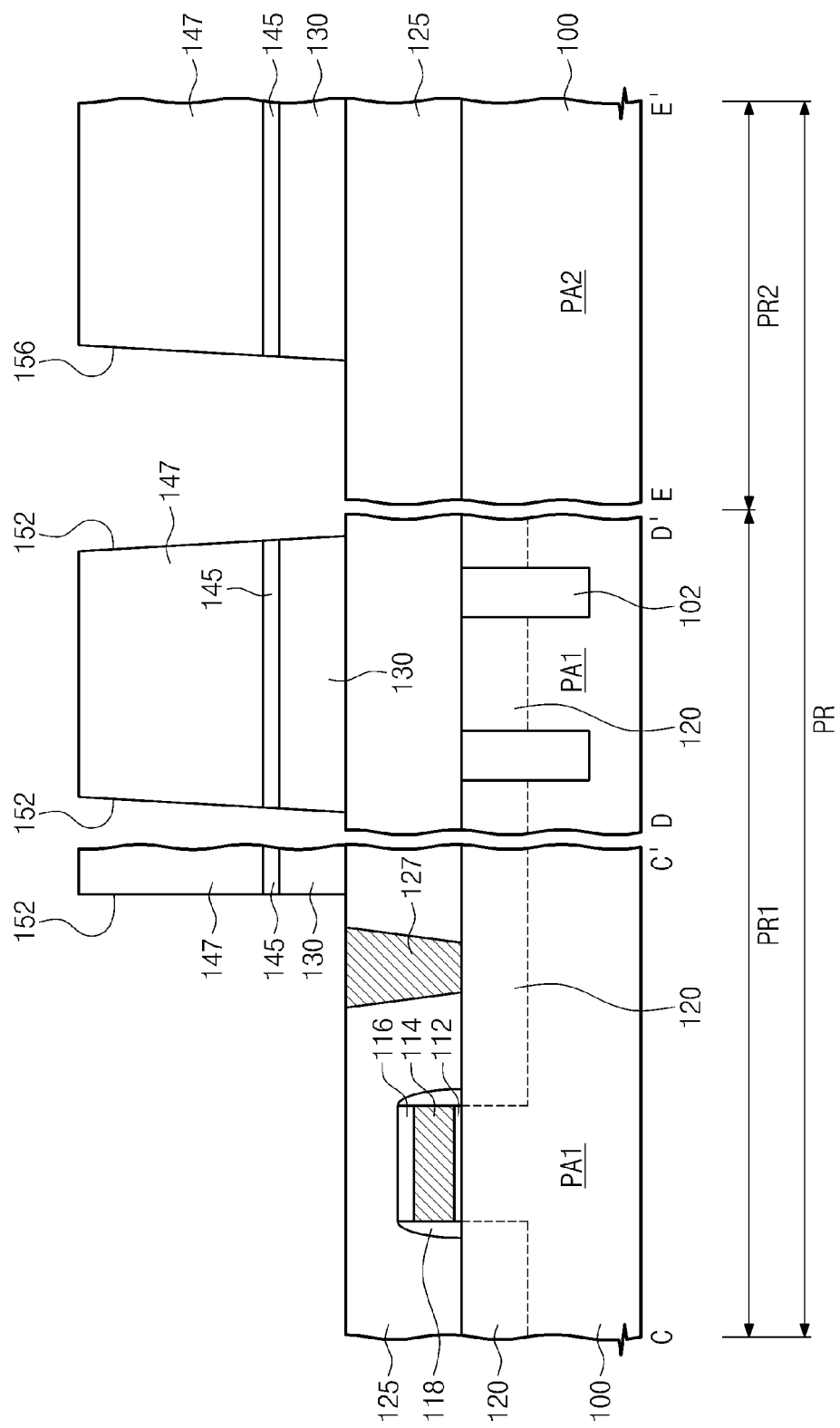

METHODS FOR MANUFACTURING A DATA STORAGE DEVICE

CROSS-REFERENCE TO RELATED APPLICATION

This U.S. non-provisional patent application claims priority under 35 U.S.C. §119 to Korean Patent Application No. 10-2013-0082976, filed on Jul. 15, 2013 in the Korean Intellectual Property Office, the disclosure of which is hereby incorporated herein by reference in its entirety.

BACKGROUND

The present inventive concepts relate to methods for manufacturing a semiconductor device and, more particularly, to methods for manufacturing a data storage device.

Semiconductor devices are widely used in the electronic industry because of their small size, multi-function capabilities, and/or low manufacturing costs. Data storage devices are semiconductor devices that may store logic data. Data storage devices have become more highly integrated with the development of the electronic industry. Thus, widths and spaces of elements constituting data storage devices have been reduced.

Additionally, high reliability of data storage devices has been demanded along with their higher integration. However, the reliability of data storage devices may be deteriorated as integration increases. Thus, data storage devices are being continuously developed to improve their reliability.

SUMMARY

Embodiments of the inventive concepts may provide methods for manufacturing a data storage device capable of increasing a process margin.

According to one aspect of the inventive concepts, a method for manufacturing a data storage device may include: forming an interlayer dielectric layer on a substrate; patterning the interlayer dielectric layer in a peripheral region of the substrate to form first trenches; forming first bit lines in the first trenches; patterning the interlayer dielectric layer between the first bit lines to form second trenches extending along the first trenches after the formation of the first bit lines; and forming second bit lines in the second trenches.

In some embodiments, the first trenches and the second trenches may be alternately and repeatedly arranged.

In some embodiments, top surfaces of the second bit lines may be formed to be higher than top surfaces of the first bit lines, and bottom surfaces of the second bit lines may be formed to be disposed at substantially the same height as bottom surfaces of the first bit lines.

In some embodiments, the first bit lines and the second bit lines may include the same material.

In some embodiments, the method may further include: etching the interlayer dielectric layer in the peripheral region to form a first interconnection trench; and forming a first interconnection in the first interconnection trench. The first interconnection trench may be formed substantially simultaneously with the first trenches, and the first interconnection may be formed substantially simultaneously with the first bit lines.

In some embodiments, top surfaces of the second bit lines may be formed to be higher than a top surface of the first interconnection.

In some embodiments, a top surface of the first interconnection may have a height that is substantially the same as a height of top surfaces of the first bit lines, and a bottom surface of the first interconnection may have a height that is substantially the same as bottom surfaces of the first bit lines.

In some embodiments, the method may further include: forming data storage parts arranged two-dimensionally in plan view in a cell region of the substrate, the interlayer dielectric layer covering the data storage parts; patterning the interlayer dielectric layer to form third trenches exposing the data storage parts; and forming third bit lines in the third trenches. The third bit lines may be formed substantially simultaneously with the first bit lines.

In some embodiments, a width of each of the third bit lines may be smaller than a width of each of the first bit lines and a width of each of the second bit lines.

In some embodiments, forming the first bit lines, the third bit lines, and the first interconnection may include: forming a conductive layer filling the first trenches, the third trenches, and the first interconnection trench; and planarizing the conductive layer until the interlayer dielectric layer is exposed.

In some embodiments, the method may further include: etching the interlayer dielectric layer in the peripheral region to form a second interconnection trench; and forming a second interconnection in the second interconnection trench. The second interconnection trench may be formed substantially simultaneously with the second trenches, and the second interconnection may be formed substantially simultaneously with the second bit lines.

In some embodiments, a top surface of the second interconnection may be formed to be higher than a top surface of the first interconnection.

In some embodiments, a bottom surface of the second interconnection may have substantially the same height as a bottom surface of the first interconnection.

In some embodiments, forming the second trenches and the second interconnection trench may include: sequentially forming a first mask layer and a second mask layer on the interlayer dielectric layer, the first bit lines, and the first interconnection; patterning the second and first mask layers to form openings defining the second trenches and the second interconnection trench; etching the interlayer dielectric layer using the second and first mask layers with the openings formed therein as etch masks; and removing the second mask layer.

In some embodiments, forming the second bit lines and the second interconnection may include: forming a conductive layer filling the second trenches and the second interconnection trench; planarizing the conductive layer until the first mask layer is exposed; and removing the first mask layer.

BRIEF DESCRIPTION OF THE DRAWINGS

The inventive concepts will become more readily apparent through the following detailed description made with reference to the accompanying drawings, in which:

FIGS. 2B, 3B, 4B, 5B, 6B, 7B, 8B and 9B are somewhat schematic cross-sectional views of the data storage device taken along lines A-A' and B-B' of FIGS. 2A, 3A, 4A, 5A, 6A, 7A, 8A, and 9A, respectively;

FIGS. 2C, 3C, 4C, 5C, 6C, 7C, 8C and 9C are somewhat schematic cross-sectional views of the data storage device taken along lines C-C', D-D', and E-E' of FIGS. 2A, 3A, 4A, 5A, 6A, 7A, 8A, and 9A, respectively;

DETAILED DESCRIPTION OF THE EMBODIMENTS

Figure 1A:
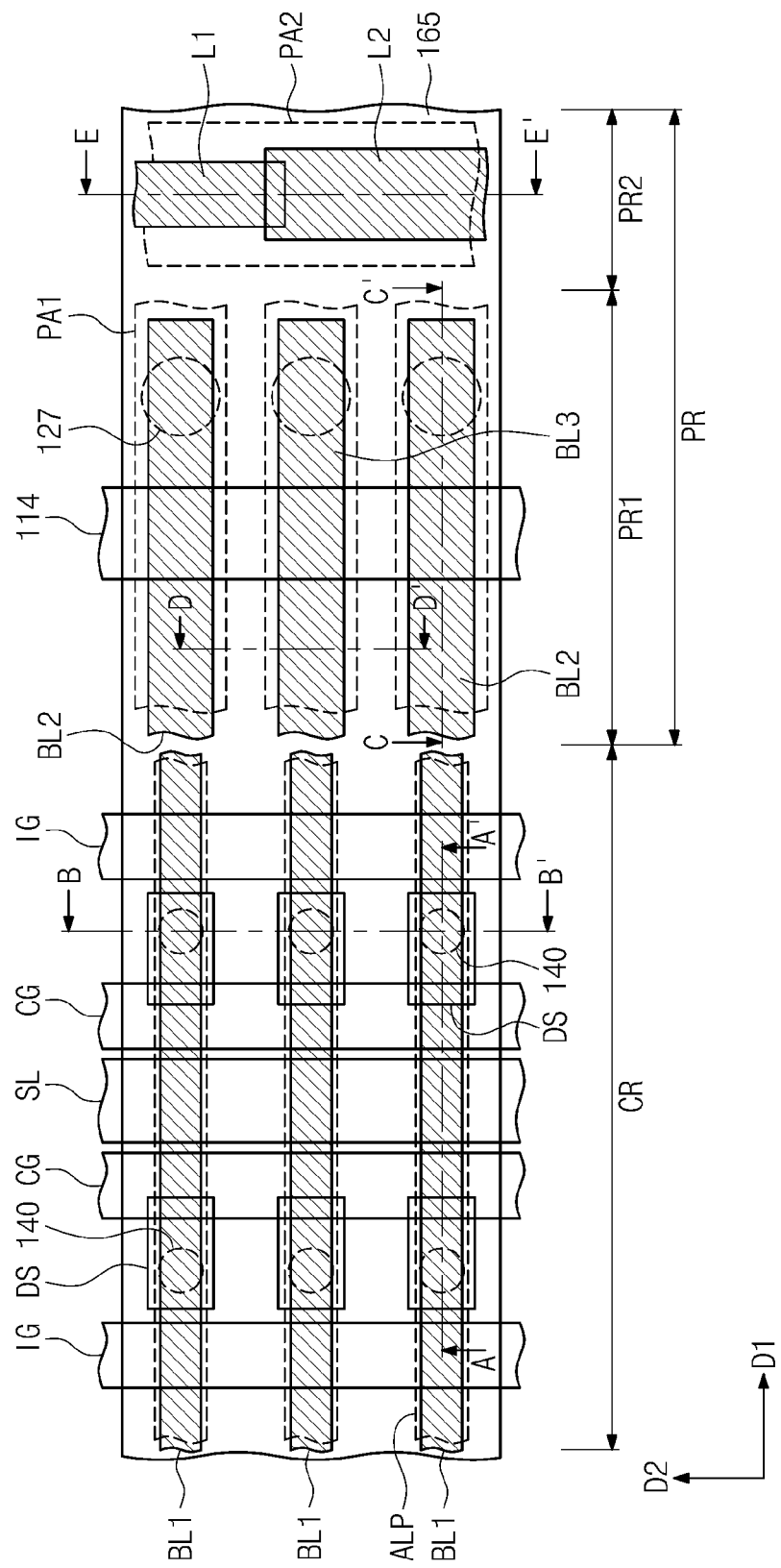
FIG. 1A is a somewhat schematic plan view of a data storage device constructed according to one or more embodiments of the inventive concepts.

The principles of the inventive concepts will now be described more fully hereinafter with reference to the accompanying drawings, in which exemplary embodiments of the inventive concepts are shown. Advantages and features of the inventive concepts and methods of achieving them will be apparent from the following exemplary embodiments. It should be noted, however, that the inventive concepts are not limited to the following exemplary embodiments, and may be implemented in various forms. Accordingly, the exemplary embodiments are provided only to disclose the inventive concepts to those skilled in the art. In the drawings, embodiments of the inventive concepts are not limited to the specific examples provided herein and shapes and sizes of regions, areas, or elements may be exaggerated for clarity.

The terminology used herein is for the purpose of describing these particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of the stated features, integers, steps, operations, elements, and/or components, but do not preclude the presence or addition of one or more other features, integers, steps, operations, elements, components, and/or groups thereof.

Moreover, exemplary embodiments are described herein with reference to cross-sectional illustrations and/or planar illustrations that are idealized exemplary illustrations. Accordingly, shapes or sizes of the elements shown in the exemplary views may be modified according to manufacturing techniques and/or allowable tolerances. Accordingly, variations from the shapes and sizes of the illustrations as a result, for example, of manufacturing techniques and/or tolerances, are to be expected. Thus, the inventive concepts should not be construed as being limited to the shapes or sizes of regions illustrated herein but are to include deviations in shapes and sizes that result, for example, from manufacturing processes or techniques. For example, an etching region illustrated as a rectangle will, typically, have rounded or curved features. Thus, the regions illustrated in the figures are schematic in nature and their shapes are not intended to illustrate the actual shape of a region of a device and are further not intended to limit the scope of the inventive concepts. The inventive concepts should therefore not be construed as being limited to the specific embodiments described herein.

It will be also understood that although the terms "first", "second", "third", etc., may be used herein to describe various elements, these elements should not be limited by these terms. These terms are only used to distinguish one element from another element. Thus, a "first" element in some embodiments could be termed a "second" element in other embodiments without departing from the teachings of the present invention. Exemplary embodiments of the present inventive concepts explained and illustrated herein include their complementary counterparts. The same reference numerals or reference designators denote the same elements throughout the specification.

Figure 1B:
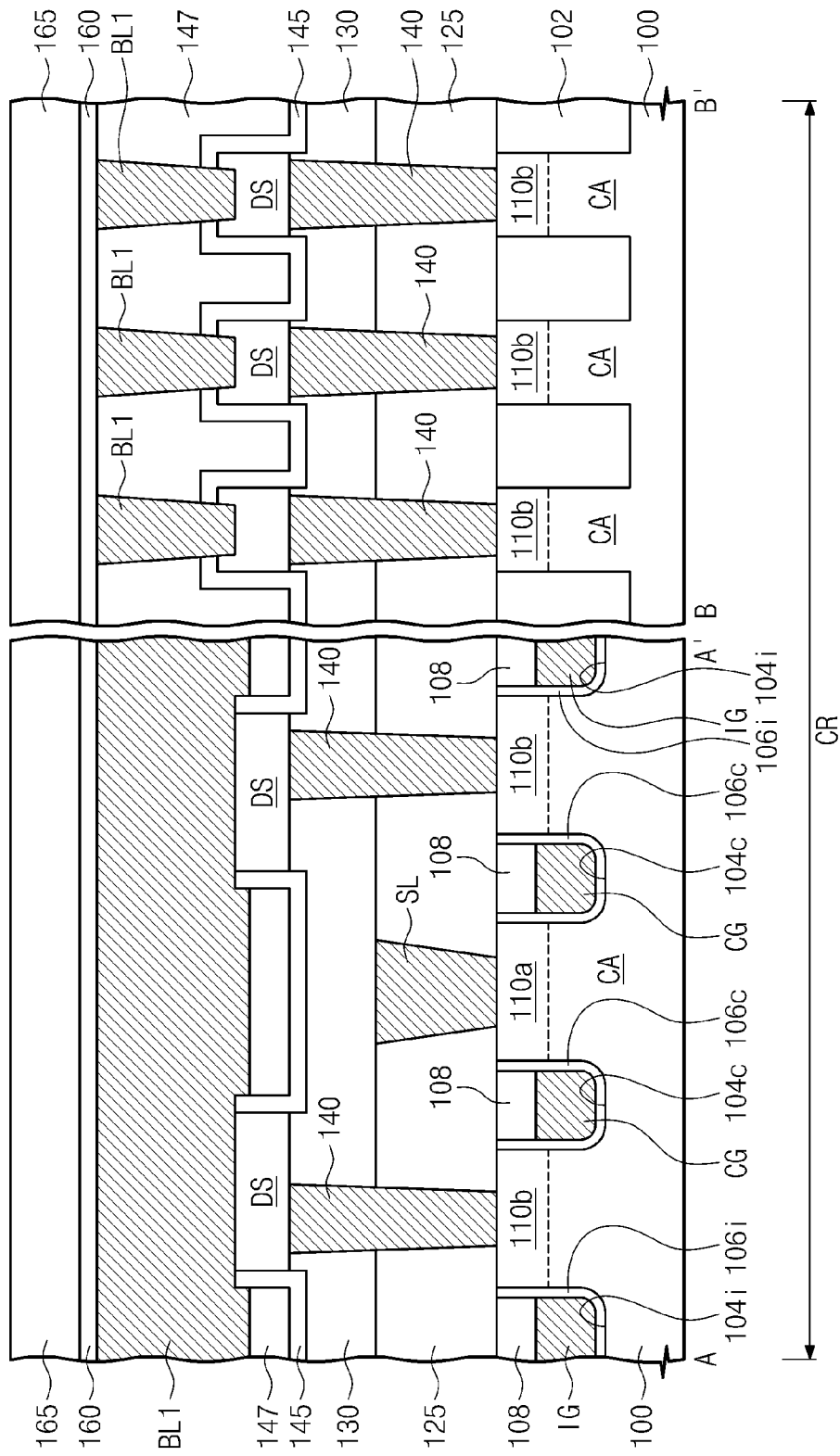
FIG. 1B includes somewhat schematic cross-sectional views of the data storage device taken along lines A-A' and B-B' of FIG. 1A.
Figure 1C:
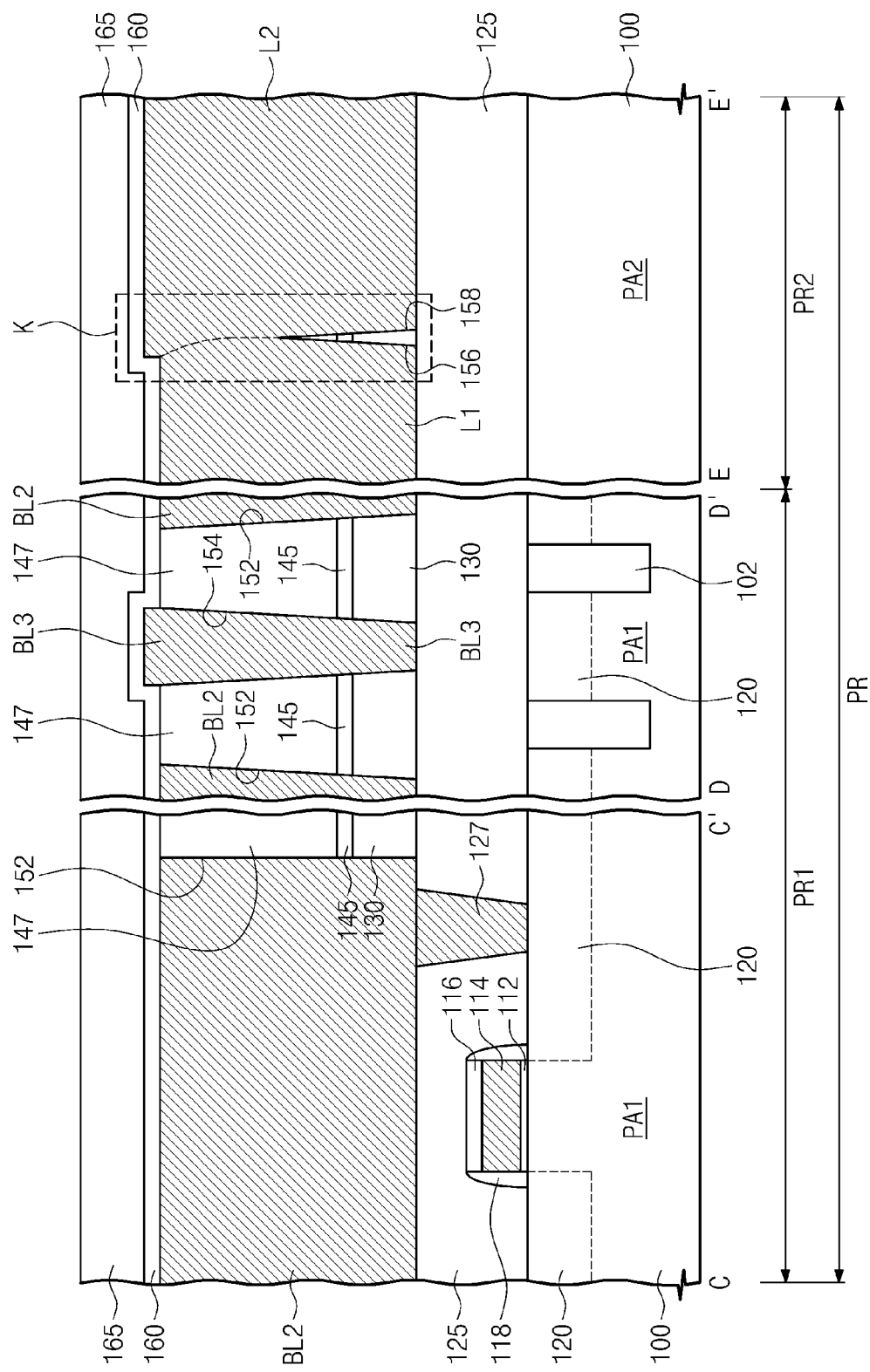
FIG. 1C includes somewhat schematic cross-sectional views of the data storage device taken along lines C-C', D-D', and E-E' of FIG. 1A.

FIG. 1A is a somewhat schematic plan view of a data storage device constructed according to one or more embodiments of the inventive concepts. FIG. 1B provides somewhat schematic cross-sectional views of the data storage device taken along lines A-A' and B-B' of FIG. 1A. FIG. 1C provides somewhat schematic cross-sectional views of the data storage device taken along lines C-C', D-D', and E-E' of FIG. 1A.

Referring to FIGS. 1A, 1B, and 1C, a semiconductor substrate 100 may include a cell region CR and a peripheral region PR. The cell region CR may include memory cells, and the peripheral region PR may include peripheral circuits. The peripheral region PR may include a first peripheral region PR1 and a second peripheral region PR2. The second peripheral region PR2 may be any region in which portions of peripheral interconnections overlap with each other. The semiconductor substrate 100 may, for example, be a silicon substrate, a germanium substrate, or a silicon-germanium substrate.

Device isolation patterns 102 may be formed in or on the semiconductor substrate 100. The device isolation patterns 102 of the cell region CR may define active line patterns ALP. The device isolation patterns 102 and the active line patterns ALP of the cell region CR may extend in parallel with each other along a first direction D1 when viewed in plan view. The device isolation patterns 102 and the active line patterns ALP of the cell region CR may be alternately arranged in a second direction D2 that is perpendicular to the first direction D1. The active line patterns ALP may be doped with dopants having a first conductivity type.

The device isolation patterns 102 of the first and second peripheral regions PR1 and PR2, respectively, may define a first peripheral active portion PA1 and a second peripheral active portion PA2 in the first peripheral region PR1 and the second peripheral region PR2, respectively. The first peripheral active portion PA1 and the second peripheral active portion PA2 may be doped with dopants having the first conductivity type or with dopants having a second conductivity type that is different from the first conductivity type.

Isolation recess regions 104i may cross the active line patterns ALP and the device isolation patterns 102 in the cell region CR. The isolation recess regions 104i may divide each of the active line patterns ALP into cell active portions CA. Each of the cell active portions CA may be a portion of the active line pattern ALP that is disposed between a pair of adjacent isolation recess regions 104i. In other words, each of the cell active portions CA may be defined by a pair of adjacent device isolation patterns 102 and the pair of adjacent isolation recess regions 104i. The cell active portions CA may be arranged two-dimensionally along rows and columns when viewed in plan view. The cell active portions CA, formed by dividing the active line patterns ALP, may be arranged along the rows parallel to the first direction D1 and the columns parallel to the second direction D2.

At least one gate recess region 104c may cross the cell active portions CA arranged along each column. The gate recess region 104c may extend in parallel with the isolation recess regions 104i. In some embodiments, a pair of gate recess regions 104c may cross the cell active portions CA arranged along each column. In this case, a pair of cell transistors may be disposed in each of the cell active portions CA.

A height of a bottom surface of each gate recess region 104c may be substantially the same as a height of a bottom surface of each isolation recess region 104i. The heights of the bottom surfaces of the gate and isolation recess regions 104c and 104i may be higher than a height of a bottom surface of each device isolation pattern 102 of the cell region CR.

Cell gate electrodes CG may be disposed in the gate recess regions 104c, respectively. A cell gate dielectric layer 106c may be disposed between each of the cell gate electrodes CG and an inner surface of each of the gate recess regions 104c. The cell gate electrodes CG may have substantially linear shapes extending in the second direction D2 due to the shapes of the gate recess regions 104c. The cell transistor including the cell gate electrode CG may therefore include a recessed channel region defined by the gate recess region 104c.

Isolation gate electrodes IG may be disposed in the isolation recess regions 104i. An isolation gate dielectric layer 106i may be disposed between each of the isolation gate electrodes IG and an inner surface of each of the isolation recess regions 104i. The isolation gate electrodes IG may also have substantially linear shapes extending in the second direction D2.

Capping patterns 108 may be disposed on each of the cell and isolation gate electrodes CG and IG, respectively. The capping patterns 108 may be disposed in the cell and isolation recess regions 104c and 104i, respectively. Top surfaces of the capping patterns 108 may be substantially coplanar with a bottom surface of the semiconductor substrate 100.

When the data storage device operates, an isolation voltage may be applied to the isolation gate electrodes IG. The isolation voltage may prevent channels from being generated under the inner surfaces of the isolation recess regions 104i. In other words, isolation channel regions under the isolation gate electrodes IG may be turned off by the isolation voltage. Thus, the cell active portions CA formed by dividing each active line pattern ALP may be electrically isolated from each other. In some embodiments, if the active line patterns ALP are doped with P-type dopants, the isolation voltage may be a ground voltage or a negative voltage.

The cell gate electrodes CG may, for example, include at least one of a semiconductor material doped with dopants (e.g., doped silicon), a metal (e.g., tungsten, aluminum, titanium, and/or tantalum), a conductive metal nitride (e.g., titanium nitride, tantalum nitride, and tungsten nitride), and a metal-semiconductor compound (e.g., a metal silicide). In some embodiments, the isolation gate electrodes IG may be formed of the same material as the cell gate electrodes CG. The cell gate dielectric layer 106c and the isolation gate dielectric layer 106i may, for example, include an oxide (e.g., silicon oxide), a nitride (e.g., silicon nitride), an oxynitride (e.g., silicon oxynitride), and/or a high-k dielectric material (e.g., an insulating metal oxide such as hafnium oxide and/or aluminum oxide). The capping patterns 108 may include an oxide (e.g., silicon oxide), a nitride (e.g., silicon nitride), and/or an oxynitride (e.g., silicon oxynitride).

A first dopant region 110a may be disposed in each cell active portion CA at a side of the cell gate electrode CG, and a second dopant region 110b may be disposed in each cell active portion CA at another side of the cell gate electrode CG. In some embodiments, the first dopant region 110a may be disposed in each cell active portion CA between the pair of cell gate electrodes CG when viewed in plan view. The second dopant region 110b may be disposed in each cell active portion CA between a cell gate electrode CG and an adjacent isolation gate electrode IG. Thus, a pair of cell transistors formed in each cell active portion CA may share the first dopant region 110a. The first and second dopant regions 110a and 110b, respectively, may correspond to source/drain regions of the cell transistor. The first and second dopant regions 110a and 110b, respectively, may be doped with dopants of the second conductivity type, which may be different from the first conductivity type. For example, one of the first and second conductivity type dopants may be an N-type dopant, and the other may be a P-type dopant.

A peripheral gate dielectric layer 112, a peripheral gate electrode 114, and a peripheral capping pattern 116 may be sequentially stacked on the first peripheral active portion PA1 of the first peripheral region PR1. Peripheral source/drain regions 120 may be disposed in the first peripheral active portion PA1 at both sides of the peripheral gate electrode 114. Gate spacers 118 may be disposed on both sidewalls of the peripheral gate electrode 114. The peripheral source/drain regions 120 may be doped with dopants of a conductivity type different from that of dopants of the first peripheral active portion PA1. Unlike the cell transistor, a peripheral transistor including the peripheral gate electrode 114 may include a planar channel region. In other words, the peripheral transistor may be a planar transistor. The peripheral transistor may, for example, be a PMOS transistor or an NMOS transistor.

The peripheral gate dielectric layer 112 may include an oxide, a nitride, an oxynitride, and/or a high-k dielectric material. The peripheral gate electrode 114 may, for example, include at least one of a semiconductor material doped with dopants (e.g., doped silicon), a metal (e.g., tungsten, aluminum, titanium, and/or tantalum), a conductive metal nitride (e.g., titanium nitride, tantalum nitride, and tungsten nitride), and a metal-semiconductor compound (e.g., a metal silicide). The peripheral capping pattern 116 may, for example, include an oxide, a nitride, and/or an oxynitride. The gate spacers 118 may include an oxide, a nitride, and/or an oxynitride.

A first interlayer dielectric layer 125 may be disposed on substantially an entire surface of the semiconductor substrate 100. Source lines SL may penetrate the first interlayer dielectric layer 125 of the cell region CR. The source lines SL may be in contact with the semiconductor substrate 100. The source lines SL may extend in the second direction D2. Each of the source lines SL may be electrically connected to the first dopant regions 110a arranged in the second direction D2. Top surfaces of the source lines SL may be substantially coplanar with a top surface of the first interlayer dielectric layer 125. The source lines SL may, for example, include at least one of a semiconductor material doped with dopants (e.g., doped silicon), a metal (e.g., tungsten, aluminum, titanium, and/or tantalum), a conductive metal nitride (e.g., titanium nitride, tantalum nitride, and tungsten nitride), and a metal-semiconductor compound (e.g., a metal silicide).

Peripheral plugs 127 may penetrate the first interlayer dielectric layer 125 of the first peripheral region PR1. The peripheral plugs 127 may be in contact with the semiconductor substrate 100. The peripheral plugs 127 may be electrically connected to the peripheral source/drain regions 120. The peripheral plugs 127 may be formed of the same conductive material as the source lines SL. Top surfaces of the peripheral plugs 127 may be substantially coplanar with the top surface of the first interlayer dielectric layer 125.

A second interlayer dielectric layer 130 may be disposed on substantially an entire surface of the first interlayer dielectric layer 125. The second interlayer dielectric layer 130 may, for example, include an oxide (e.g., silicon oxide), a nitride (e.g., silicon nitride), and/or an oxynitride (e.g., a silicon oxynitride).

Contact plugs 140 may successively penetrate the second interlayer dielectric layer 130 and the first interlayer dielectric layer 125 in the cell region CR. Each of the contact plugs 140 may be electrically connected to a respective one of the second dopant regions 110b.

Data storage elements DS may be disposed on the second interlayer dielectric layer 130 in the cell region CR. Each of the data storage elements DS may be connected to a respective one of the contact plugs 140. Each of the data storage elements DS may further be electrically connected to a corresponding one of the second dopant regions 110b through the respective one of the contact plugs 140. The data storage elements DS may be two-dimensionally arranged along rows and columns when viewed in plan view.

A third interlayer dielectric layer 145 may be disposed on surfaces of the data storage elements DS and the second interlayer dielectric layer 130. The third interlayer dielectric layer 145 may protect sidewalls of the data storage elements DS. The third interlayer dielectric layer 145 may, for example, include a nitride (e.g., silicon nitride) and/or an oxynitride (e.g., a silicon oxynitride).

A fourth interlayer dielectric layer 147 may be disposed on the third interlayer dielectric layer 145. In the cell region CR, the fourth interlayer dielectric layer 147 may fill a space between the data storage elements DS. A top surface of the fourth interlayer dielectric layer 147 in the cell region CR may be disposed at substantially the same height as a top surface of the fourth interlayer dielectric layer 147 disposed in the first and second peripheral regions PR1 and PR2, respectively. The fourth interlayer dielectric layer 147 may, for example, include an oxide (e.g., silicon oxide), a nitride (e.g., silicon nitride), and/or an oxynitride (e.g., a silicon oxynitride).

First bit lines BL1 may penetrate the fourth and third interlayer dielectric layers 147 and 145 in the cell region CR to contact the data storage elements DS. The first bit lines BL1 may be directly connected to the data storage elements DS. Therefore, a contact plug may not exist between the first bit lines BL1 and the data storage elements DS. The first bit lines BL may extend in the first direction D1. Each of the first bit lines BL1 may be connected to the data storage elements DS arranged along a line extending in the first direction D1. The first bit lines BL1 may vertically overlap with the active line patterns ALP, respectively. Thus, the first bit lines BL1 may be disposed over the active line patterns ALP, respectively.

According to some embodiments, a width of an upper portion of each of the first bit lines BL1 may be greater than a width of a lower portion of each of the first bit lines BL1. In other words, the first bit lines BL may have inclined sidewalls. The first bit lines BL1 may, for example, include at least one of a metal and a conductive metal nitride. For example, the first bit lines BL may include copper (Cu).

Second bit lines BL2 and third bit lines BL3 may penetrate the interlayer dielectric layers 147, 145, and 130 of the first peripheral region PR1 to be connected to the peripheral plugs 127. The second bit lines BL2 and the third bit lines BL3 may extend in the first direction D1 and may be alternately and repeatedly arranged in the second direction D2. The second bit lines BL2 and the third bit lines BL3 may vertically overlap with the first peripheral active portions PA1. Thus, the second bit lines BL2 and the third bit lines BL3 may each be disposed over respective ones of the first peripheral active portions PA1.

Top surfaces of the second bit lines BL2 may be substantially coplanar with top surfaces of the first bit lines BL1. On the contrary, a height of bottom surfaces of the second bit lines BL2 may be lower than a height of bottom surfaces of the first bit lines BL1. In some embodiments, each of the second bit lines BL2 may laterally contact one of the first bit lines BL1 without an interface therebetween.

A height of top surfaces of the third bit lines BL3 may be higher than a height of the top surfaces of the first and second bit lines BL1 and BL2, respectively. Bottom surfaces of the third bit lines BL3 may be substantially coplanar with the bottom surfaces of the second bit lines BL2. A height of the bottom surfaces of the third bit lines BL3 may be lower than the height of the bottom surfaces of the first bit lines BL1. In some embodiments, each of the third bit lines BL3 may laterally contact one of the first bit lines BL1 without an interface therebetween.

In some embodiments, a width of an upper portion of each of the second and third bit lines BL2 and BL3 may be greater than a width of a lower portion of each of the second and third bit lines BL2 and BL3. In other words, the second bit lines BL2 and the third bit lines BL3 may each have inclined sidewalls. The second and third bit lines BL2 and BL3 may include the same material as the first bit lines BL1. The second bit lines BL2 and the third bit lines BL3 may, for example, include at least one of a metal and a conductive metal nitride. For example, the second bit lines BL2 and the third bit lines Bl3 may include copper (Cu).

A first interconnection L1 and a second interconnection L2 may penetrate the interlayer dielectric layers 147, 145, and 130 in the second peripheral region PR2. One end of the first interconnection L1 may overlap with one end of the second interconnection L2.

A top surface of the first interconnection L1 may be substantially coplanar with the top surfaces of the second bit lines BL2, and a bottom surface of the first interconnection L1 may be substantially coplanar with the bottom surfaces of the second bit lines BL2. A height of a top surface of the second interconnection L2 may be higher than a height of the top surface of the first interconnection L1. The top surface of the second interconnection L2 may be substantially coplanar with the top surfaces of the third bit lines BL3, and a bottom surface of the second interconnection L2 may be substantially coplanar with the bottom surfaces of the third bit lines BL3. The bottom surface of the second interconnection L2 may be substantially coplanar with the bottom surface of the first interconnection L1.

The first interconnection L1 and the second interconnection L2 may include the same material as the first, second, and third bit lines BL1, BL2, and BL3. The first and second interconnections L1 and L2, respectively, may, for example, include at least one of a metal and a conductive metal nitride. In some embodiments, the first and second interconnections L1 and L2, respectively, may include copper (Cu).

A first layer 160 and a second layer 165 may be disposed on substantially the entire surface of the semiconductor substrate 100. The first layer 160 and the second layer 165 may be sequentially stacked on the fourth interlayer dielectric layer 147 and may cover the first, second, and third bit lines BL1, BL2, and BL3, respectively, and the first and second interconnections L1 and L2, respectively.

Figure 10:
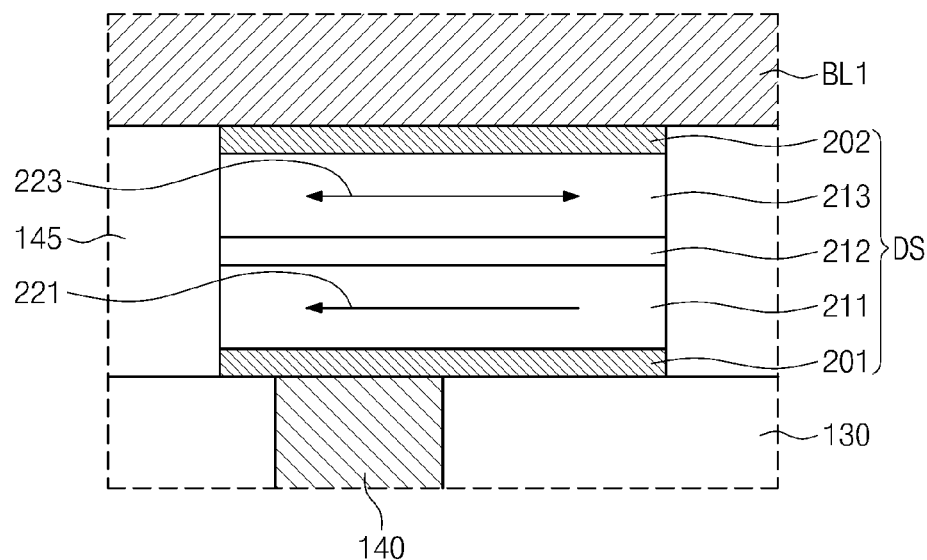
FIG. 10 is a somewhat schematic cross-sectional view of a data storage element of a data storage device according to one or more embodiments of the inventive concepts.
Figure 11:
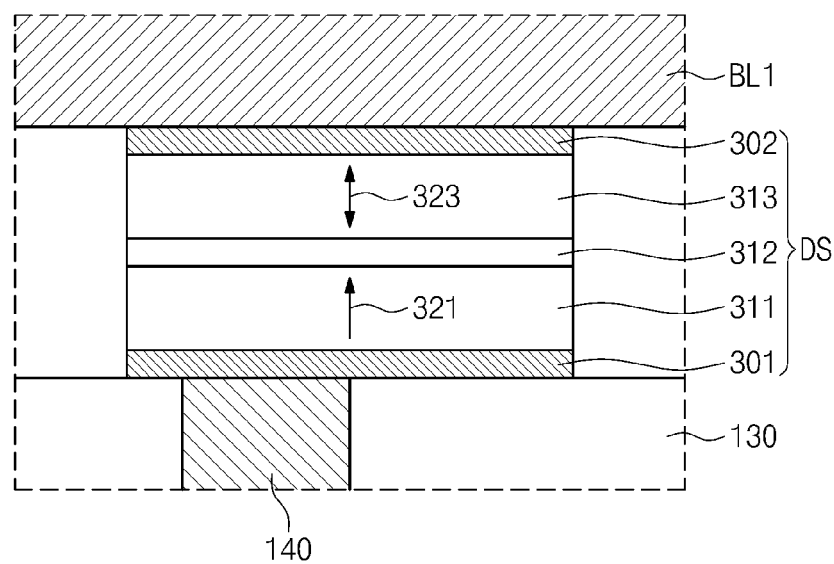
FIG. 11 is a somewhat schematic cross-sectional view of a data storage element of a data storage device according to one or more other embodiments of the inventive concepts.

FIG. 10 is a somewhat schematic cross-sectional view of a data storage element of a data storage device according to one or more embodiments of the inventive concepts. FIG. 11 is a somewhat schematic cross-sectional view of a data storage element of a data storage device according to one or more alternative embodiments of the inventive concepts. The data storage elements DS will now be described in more detail with reference to FIGS. 10 and 11.

Referring first to FIG. 10, a data storage element DS according to some embodiments may include a reference pattern 211, a free pattern 213, and a tunnel barrier pattern 212 disposed between the reference pattern 211 and the free pattern 213. The reference pattern 211 may have a magnetization direction 221 fixed in one direction, and the free pattern 213 may have a magnetization direction 223 changeable between a direction parallel to and a direction anti-parallel to the fixed magnetization direction 221 of the reference pattern 211. The magnetization directions 221 and 223 of the reference and free patterns 211 and 213 may be parallel to one surface of the tunnel barrier pattern 212 that is in contact with the free pattern 213. The reference pattern 211, the tunnel barrier pattern 212, and the free pattern 213 may constitute a magnetic tunnel junction.

If the magnetization direction 223 of the free pattern 213 is parallel to the magnetization direction 221 of the reference pattern 211, the data storage element DS may have a first resistance value. If the magnetization direction 223 of the free pattern 213 is anti-parallel to the magnetization direction 221 of the reference pattern 211, the data storage element DS may have a second resistance value. Here, the first resistance value may be smaller than the second resistance value. The data storage elements DS may store logic data using the resistance value difference. The magnetization direction 223 of the free pattern 213 may be changed by spin-torque of electrons in a program current (i.e., by a spin-torque transfer effect).

Each of the reference and free patterns 211 and 213 may include a ferromagnetic material. The reference pattern 211 may further include an anti-ferromagnetic material for pinning a magnetization direction of the ferromagnetic material in the reference pattern 211. The tunnel barrier pattern 212 may, for example, include at least one of magnesium oxide, titanium oxide, aluminum oxide, magnesium-zinc oxide, and magnesium-boron oxide.

The data storage element DS may further include a lower electrode 201 and an upper electrode 202. The reference pattern 211, the tunnel barrier pattern 212, and the free pattern 213 may be disposed between the lower electrode 201 and the upper electrode 202. As illustrated in FIG. 10, the reference pattern 211, the tunnel barrier pattern 212, and the free pattern 213 may be sequentially stacked on the lower electrode 201, and the upper electrode 202 may be disposed on the free pattern 213. Alternatively, the free pattern 213, the tunnel barrier pattern 212, and the reference pattern 211 may be sequentially stacked on the lower electrode 201. The lower and upper electrodes 201 and 202, respectively, may, for example, include a conductive metal nitride such as titanium nitride, tantalum nitride, and/or tungsten nitride.

Referring to FIG. 11, a data storage element according to other embodiments may include a reference perpendicular pattern 311, a free perpendicular pattern 313, and a tunnel barrier pattern 312 disposed between the reference perpendicular pattern 311 and the free perpendicular pattern 313. The reference perpendicular pattern 311 may have a magnetization direction 321 fixed in one direction. The free perpendicular pattern 313 may have a magnetization direction 323 changeable between a direction parallel to and a direction anti-parallel to the fixed magnetization direction 321 of the reference perpendicular pattern 311. Here, the magnetization directions 321 and 323 of the reference and free perpendicular patterns 311 and 313 may be substantially perpendicular to one surface of the tunnel barrier pattern 312 that is in contact with the free perpendicular pattern 313.

Each of the reference and free perpendicular patterns 311 and 313 may, for example, include at least one of a perpendicular magnetic material (e.g., CoFeTb, CoFeGd, and/or CoFeDy), a perpendicular magnetic material having an $L1_0$ structure, CoPt having a hexagonal close packed (HCP) lattice structure, and a perpendicular magnetic structure. The perpendicular magnetic material having the $L1_0$ structure may, for example, include at least one of FePt of the $L1_0$ structure, FePd of the $L1_0$ structure, CoPd of the $L1_0$ structure, and CoPt of the $L1_0$ structure. The perpendicular magnetic structure may include magnetic layers and non-magnetic layers which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where "n" denotes the number of times the magnetic layer and the non-magnetic layer are stacked). In this embodiment, the reference perpendicular pattern 311 may be thicker than the free perpendicular pattern 313, and/or a coercive force of the reference perpendicular pattern 311 may be greater than a coercive force of the free perpendicular pattern 313.

The tunnel barrier pattern 312 may, for example, include at least one of magnesium oxide, titanium oxide, aluminum oxide, magnesium-zinc oxide, and magnesium-boron oxide. The data storage element DS may further include a lower electrode 301 and an upper electrode 302. As illustrated in FIG. 11, the reference perpendicular pattern 311, the tunnel barrier pattern 312, and the free perpendicular pattern 313 may be sequentially stacked on the lower electrode 301, and the upper electrode 302 may be disposed on the free perpendicular pattern 313. Alternatively, the free perpendicular pattern 313, the tunnel barrier pattern 312, and the reference perpendicular pattern 311 may be sequentially stacked on the lower electrode 301, and the upper electrode 302 may be disposed on the reference perpendicular pattern 311. The lower and upper electrodes 301 and 302, respectively, may be formed of a conductive metal nitride.

Figure 2A:
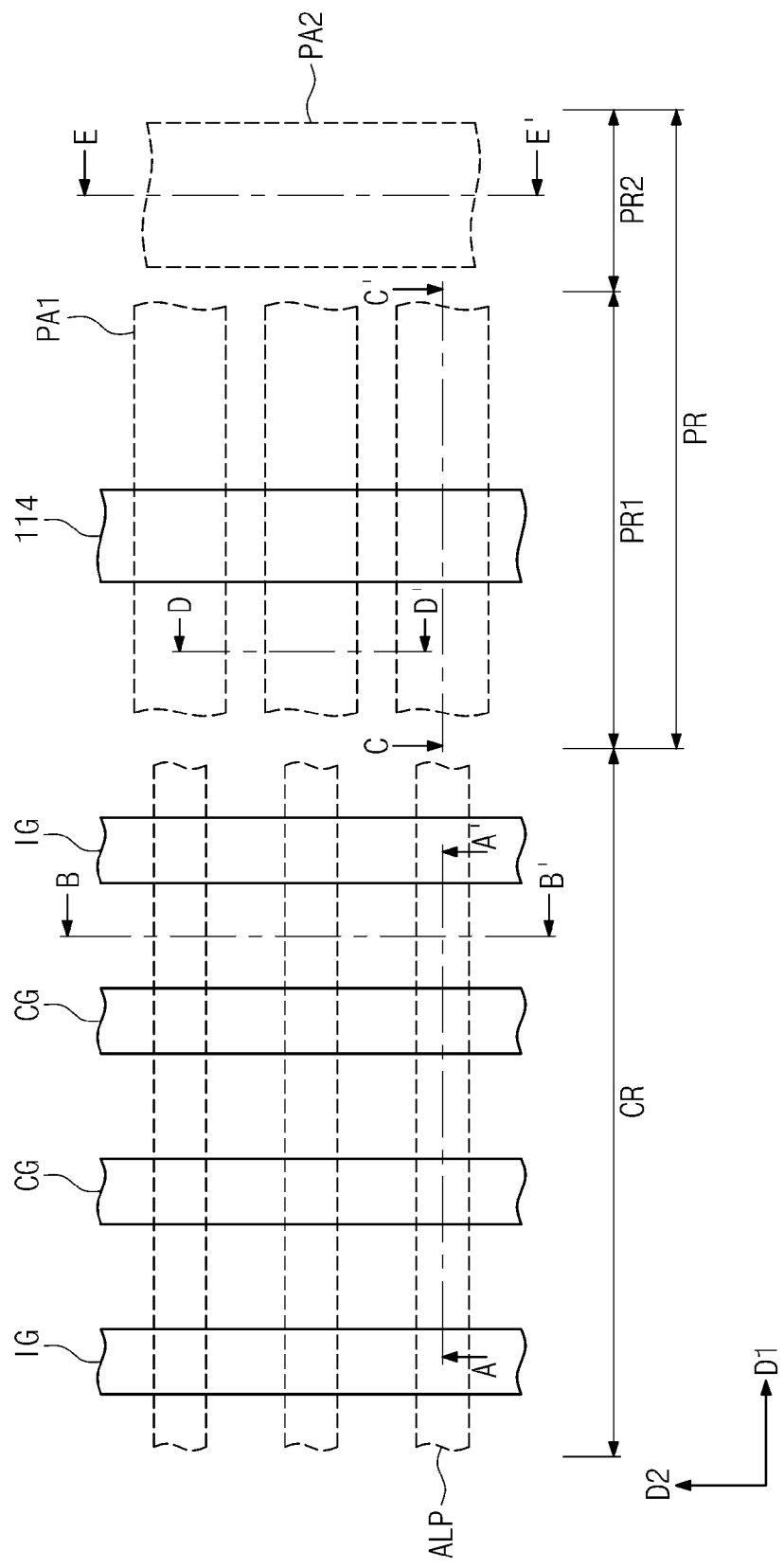
FIGS. 2A, 3A, 4A, 5A, 6A, 7A, 8A, and 9A are each somewhat schematic plan views of a data storage device being constructed using a method for manufacturing a data storage device according to various embodiments of the inventive concepts.
Figure 2C:
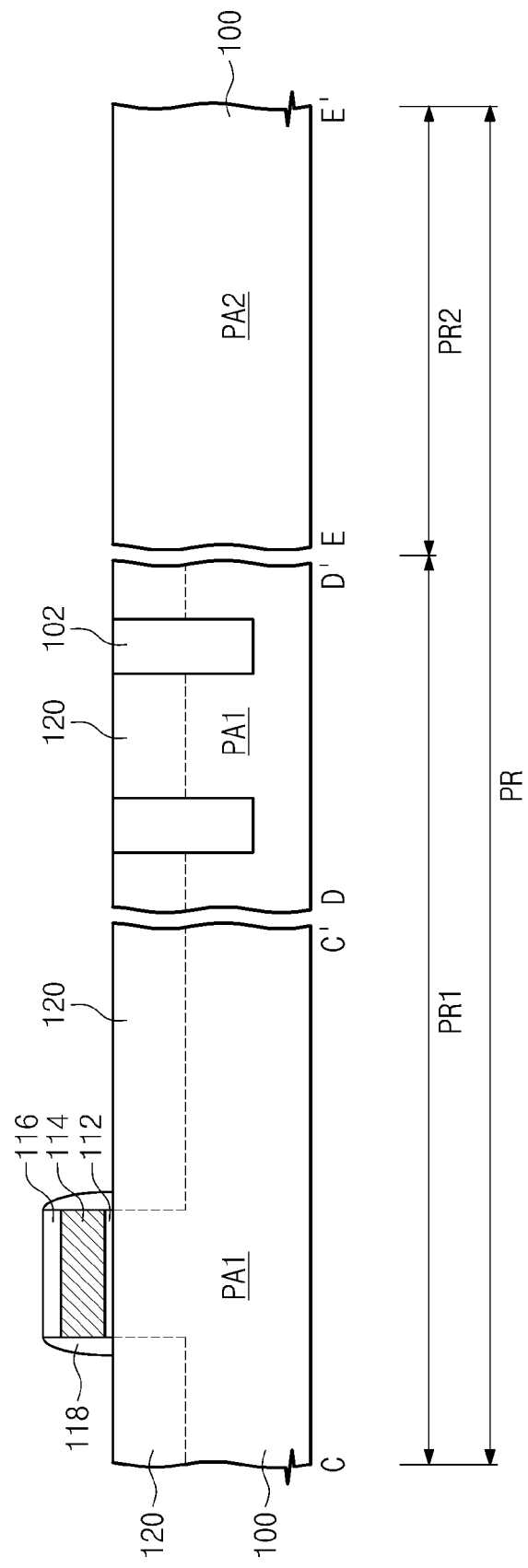
Figure 3A:
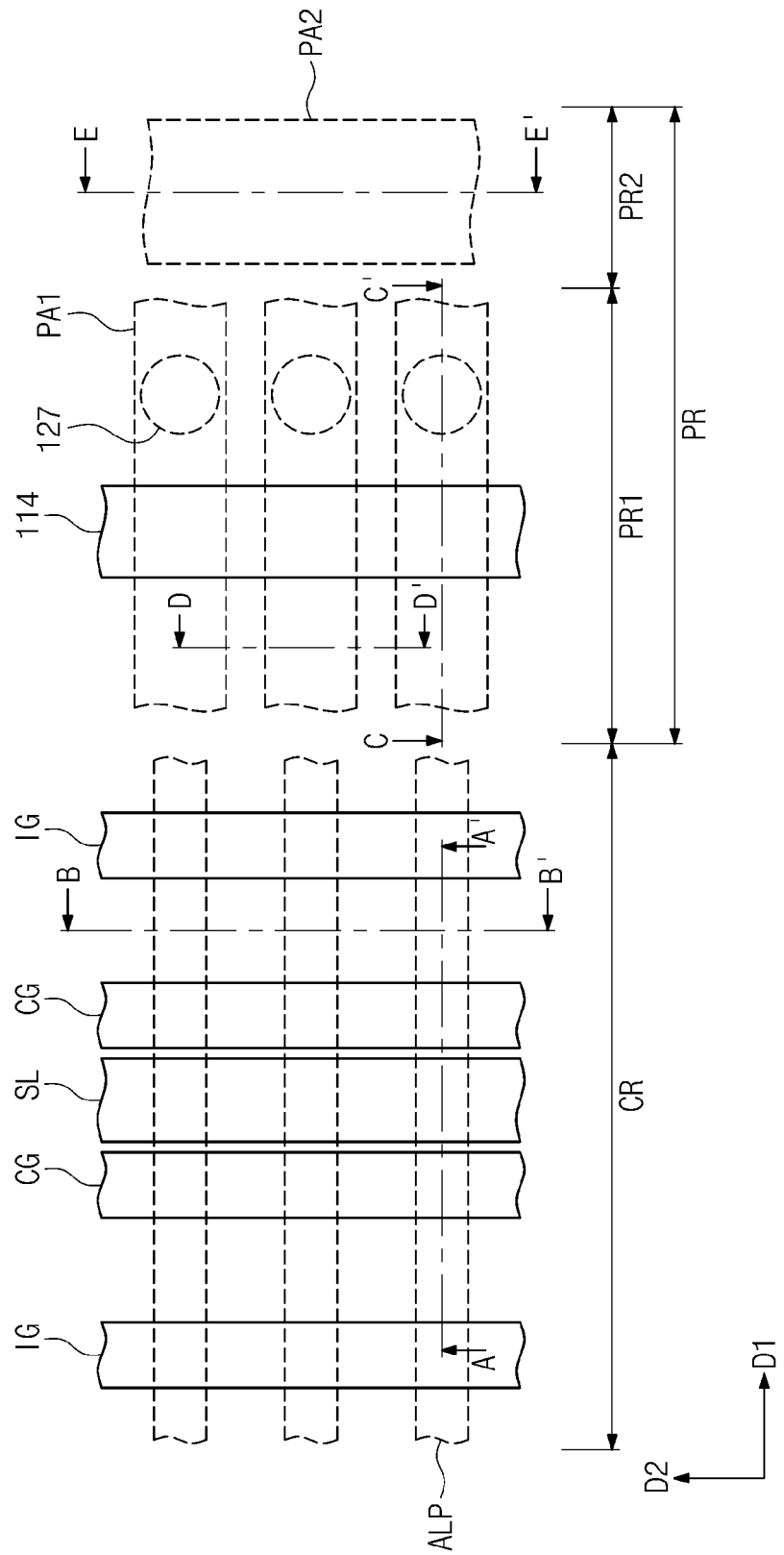
Figure 3B:
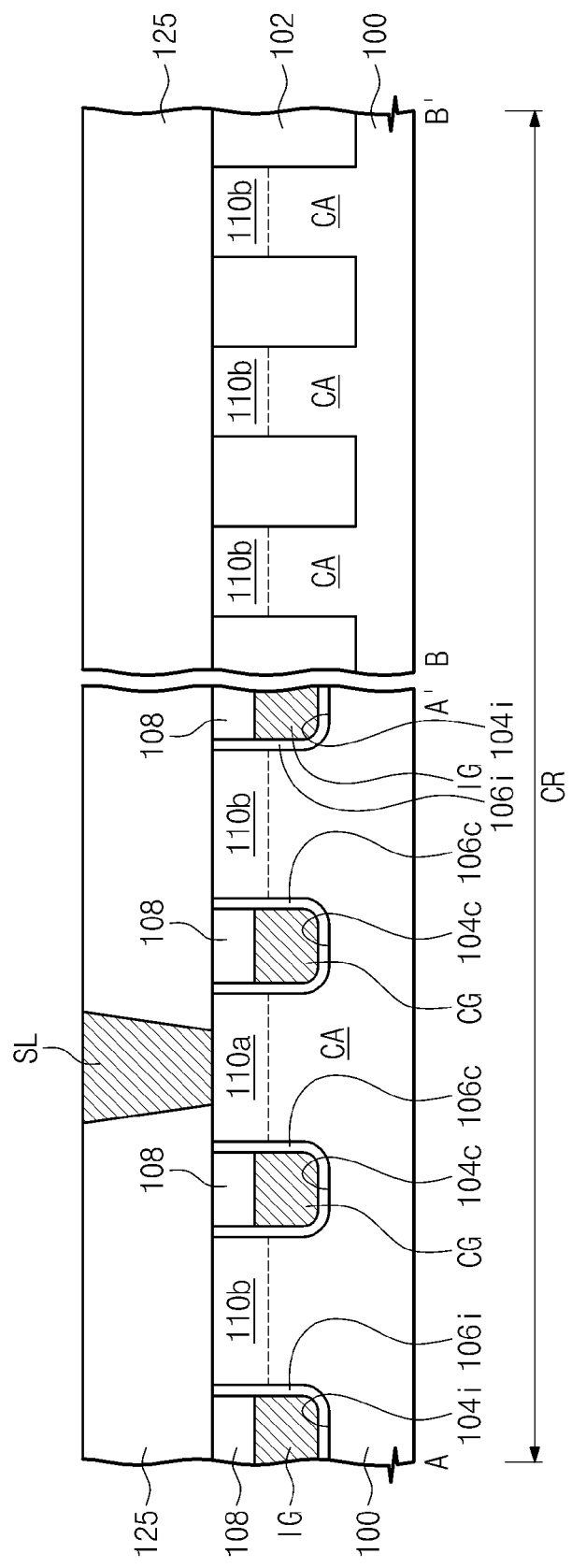
Figure 3C:
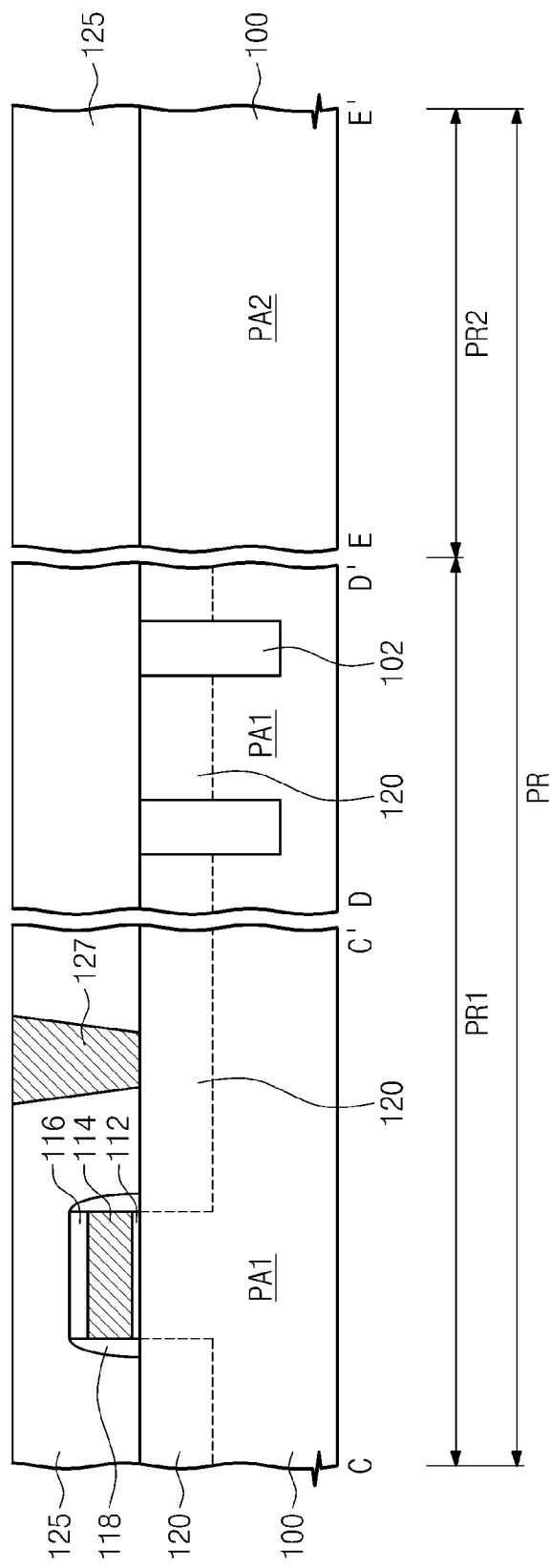
Figure 4A:
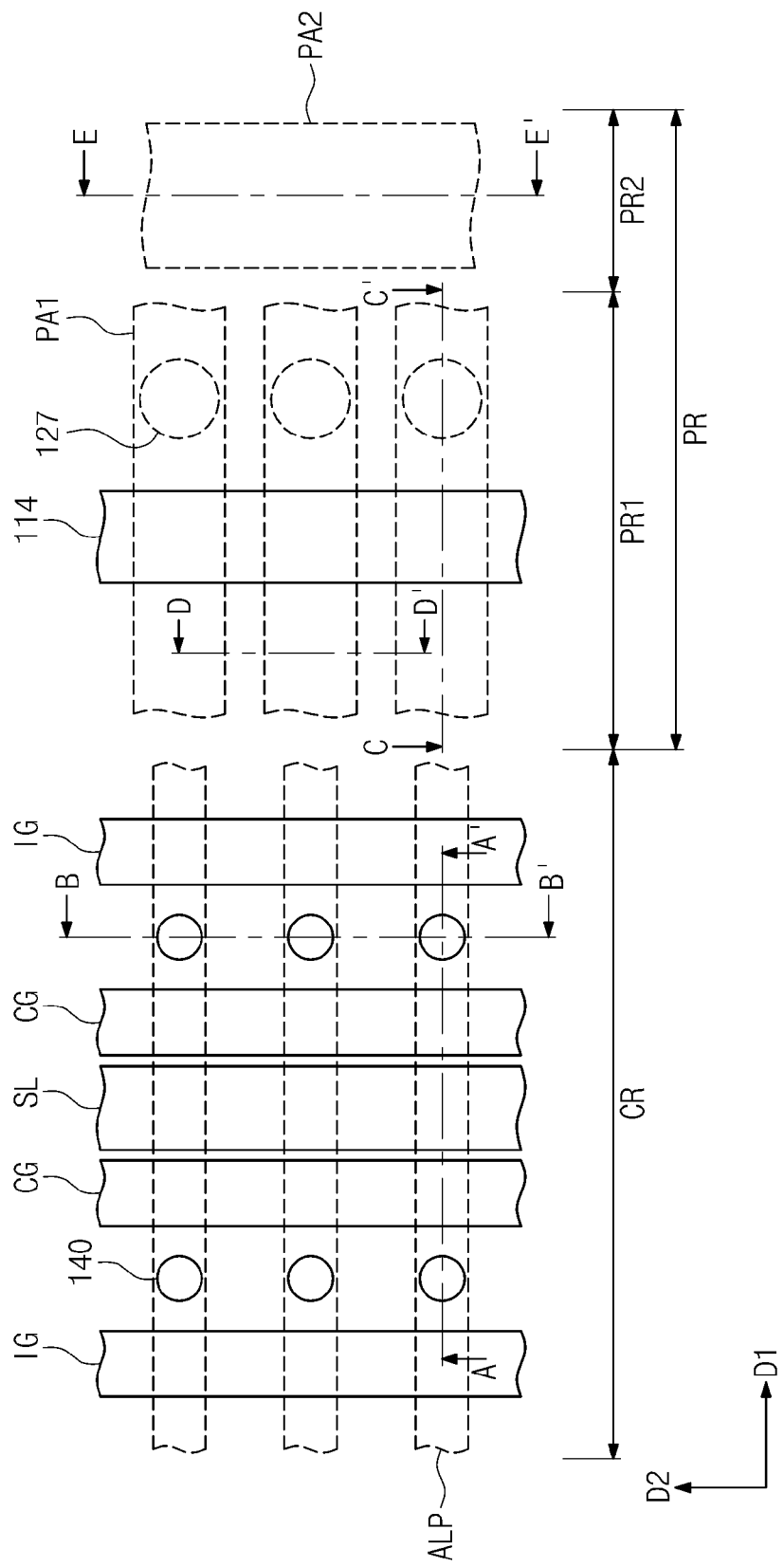
Figure 4B:
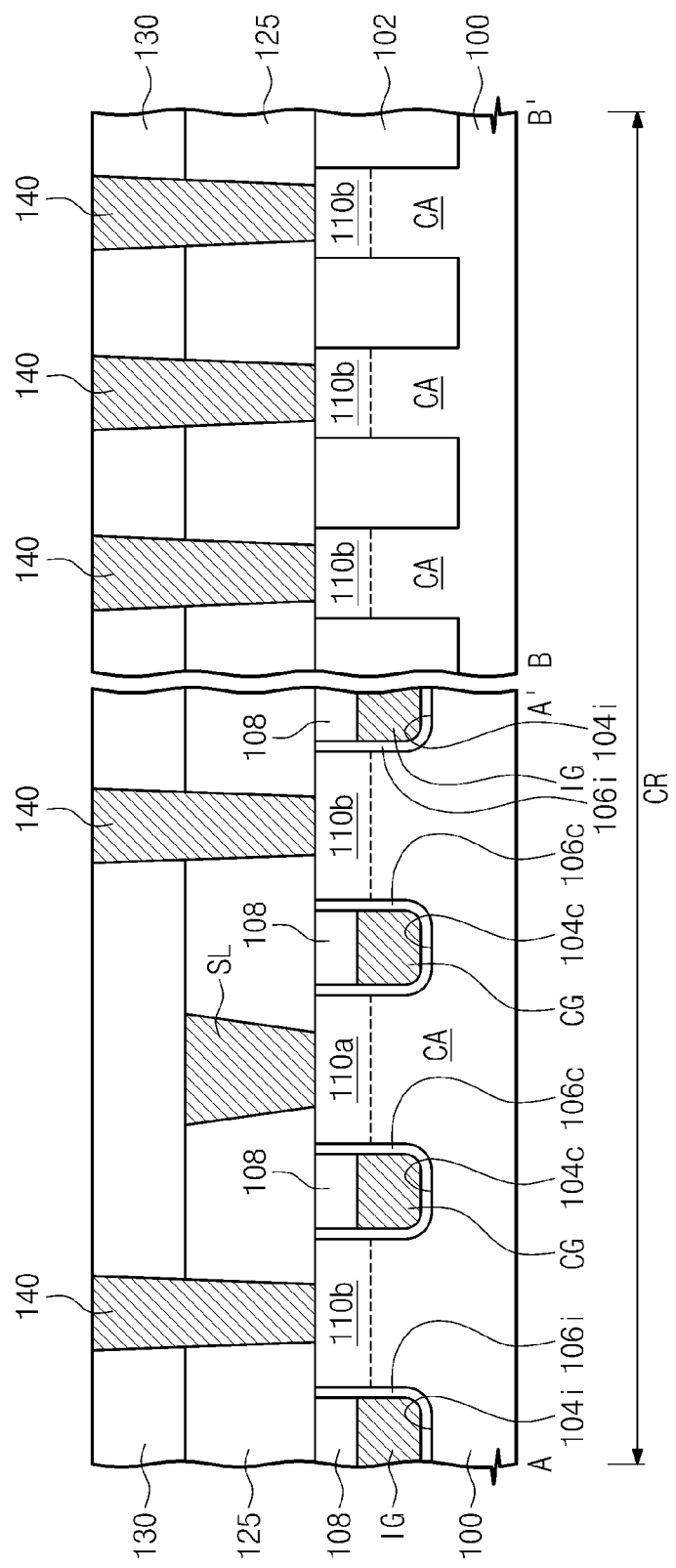
Figure 4C:
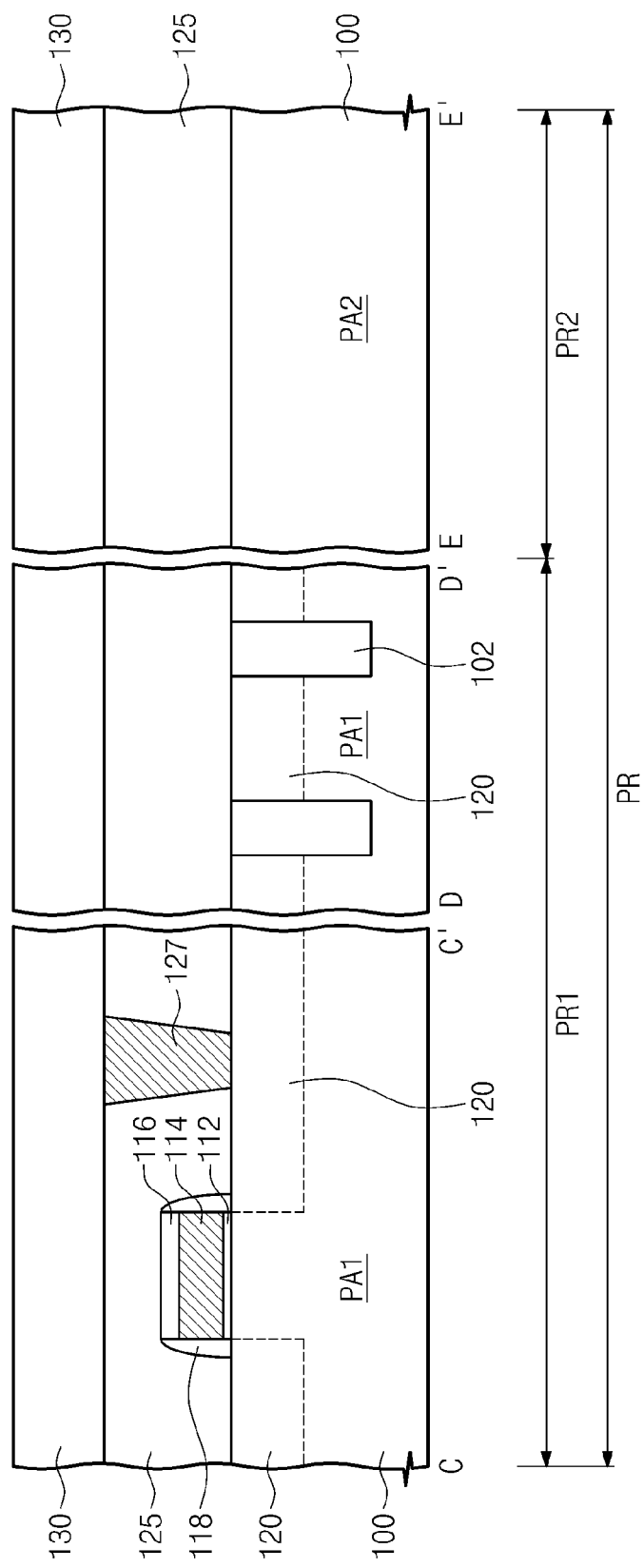
Figure 12:
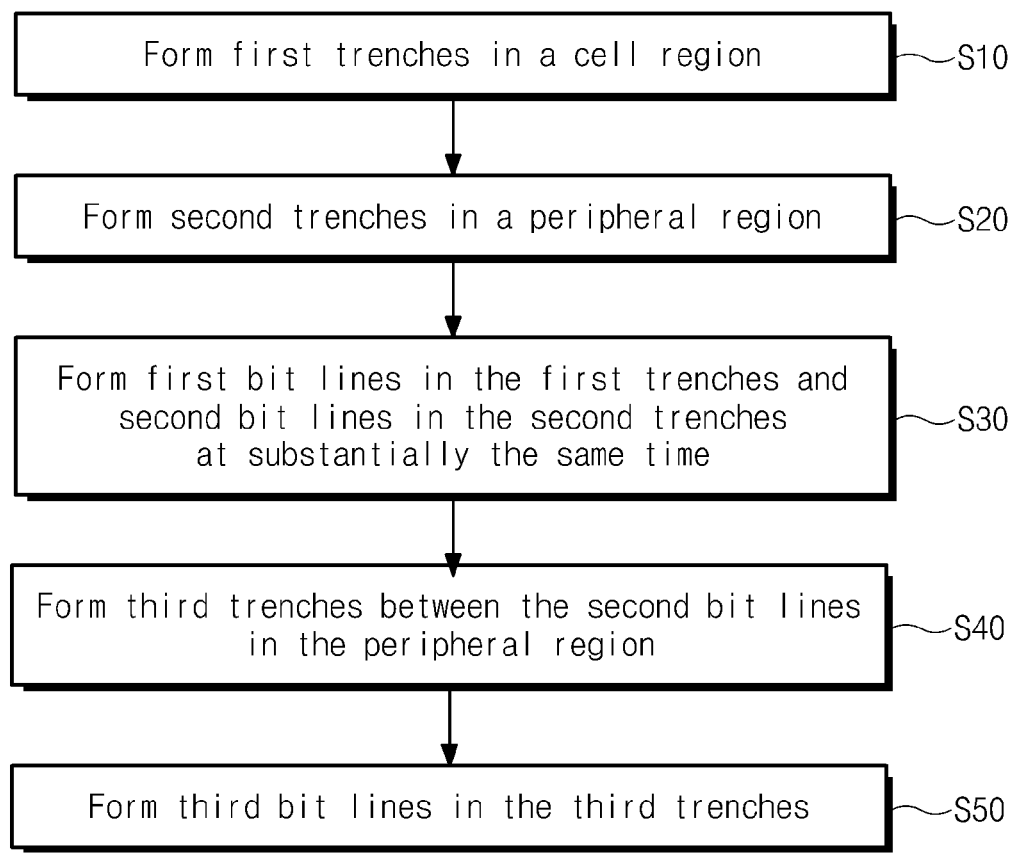
FIG. 12 is a flowchart illustrating a method for manufacturing a data storage device according to one or more embodiments of the inventive concepts.

FIGS. 2A, 3A, 4A . . . , and 9A are somewhat schematic plan views of a data storage device illustrating a method for manufacturing the data storage device according to some embodiments of the inventive concepts. FIGS. 2B, 3B, 4B . . . , and 9B are somewhat schematic cross-sectional views of the data storage device taken along lines A-A' and B-B' of FIGS. 2A, 3A, 4A . . . , and 9A, respectively. FIGS. 2C, 3C, 4C . . . , and 9C are somewhat schematic cross-sectional views of the data storage device taken along lines C-C', D-D', and E-E' of FIGS. 2A, 3A, 4A . . . , and 9A, respectively. FIG. 12 is a flowchart illustrating a method for manufacturing a data storage device according to embodiments of the inventive concepts.

Referring to FIGS. 2A, 2B, and 2C, a semiconductor substrate 100 may be provided. The semiconductor substrate 100 may include a cell region CR, a first peripheral region PRE and a second peripheral region PR2. Device isolation patterns 102 may be formed in or on the semiconductor substrate 100 to define active line patterns ALP of the cell region CR, first peripheral active portions PA1 of the first peripheral region PR1, and a second peripheral active portion PA2 of the second peripheral region PR2. The active line patterns ALP may extend substantially along a first direction D1.

The active line patterns ALP and the device isolation patterns 102 in the cell region CR may be patterned to form gate recess regions 104c and isolation recess regions 104i extending substantially in a second direction D2. The isolation recess regions 104i may divide each of the active line patterns ALP into a plurality of cell active portions CA. The gate recess regions 104 may cross the cell active portions CA. A height of bottom surfaces of the gate and isolation recess regions 104c and 104i, respectively, may be higher than a height of bottom surfaces of the device isolation patterns 102.

A cell gate dielectric layer 106c may be formed on inner surfaces of the gate recess regions 104c to have a substantially uniform thickness. An isolation gate dielectric layer 106i may be disposed on inner surfaces of the isolation recess regions 104i to have a substantially uniform thickness. In some embodiments, the cell and isolation gate dielectric layers 106c and 106i, respectively, may be formed at substantially the same time.

Subsequently, a conductive layer may be formed to fill the recess regions 104c and 104i. The conductive layer may be etched to form cell gate electrodes CG in the gate recess regions 104c and isolation gate electrodes IG in the isolation recess regions IG. Top surfaces of the cell and isolation gate electrodes CG and IG, respectively, may be recessed to be lower than a top surface of the semiconductor substrate 100.

A capping layer may be formed on the semiconductor substrate 100 to fill the recess regions 104c and 104i on the cell and isolation gate electrodes CG and IG, respectively. The capping layer may be planarized to form capping patterns 108 in the recess regions 104c and 104i.

Dopants may be injected into the cell active portions CA at both sides of the cell gate electrodes CG to form first dopant regions 110a and second dopant regions 110b. A height of bottom surfaces of the first and second dopant regions 110a and 110b, respectively, may be higher than a height of bottom surfaces of the cell gate electrodes CG.

A peripheral gate dielectric layer 112, a peripheral gate electrode 114, and a peripheral capping pattern 116 may be sequentially stacked on the first peripheral active portions PA1 in the first peripheral region PR1. Peripheral source/drain regions 120 may be formed in each of the first peripheral active portions PA1 at both sides of the peripheral gate electrode 114. Gate spacers 118 may be formed on both sidewalls of the peripheral gate electrode 114.

After cell transistors including the cell gate electrodes CG are formed, a peripheral transistor including the peripheral gate electrode 114 may be formed. Alternatively, after the peripheral transistor is formed, the cell transistors may be formed.

Referring to FIGS. 3A, 3B, and 3C, a first interlayer dielectric layer 125 may be formed on the semiconductor substrate 100. The first interlayer dielectric layer 125 may, for example, include an oxide, a nitride, and/or an oxynitride. Source lines SL may be formed to penetrate the first interlayer dielectric layer 125 in the cell region CR. The source lines SL may be connected to the first dopant regions 110a. Peripheral plugs 127 may be formed to penetrate the first interlayer dielectric layer 125 in the first peripheral region PR1. The peripheral plugs 127 may be connected to the peripheral source/drain regions 120. In some embodiments, the source lines SL and the peripheral plugs 127 may be formed at substantially the same time. The peripheral plugs 127 may be formed of the same conductive material as the source lines SL.

Referring to FIGS. 4A, 4B, and 4C, a second interlayer dielectric layer 130 may be formed on substantially an entire surface of the semiconductor substrate 100. The second interlayer dielectric layer 130 may, for example, include an oxide, a nitride, and/or an oxynitride. Contact plugs 140 may be formed to successively penetrate each of the interlayer dielectric layers 130 and 125 in the cell region CR. The contact plugs 140 may be connected to respective ones of the second dopant regions 110b.

Figure 5A:
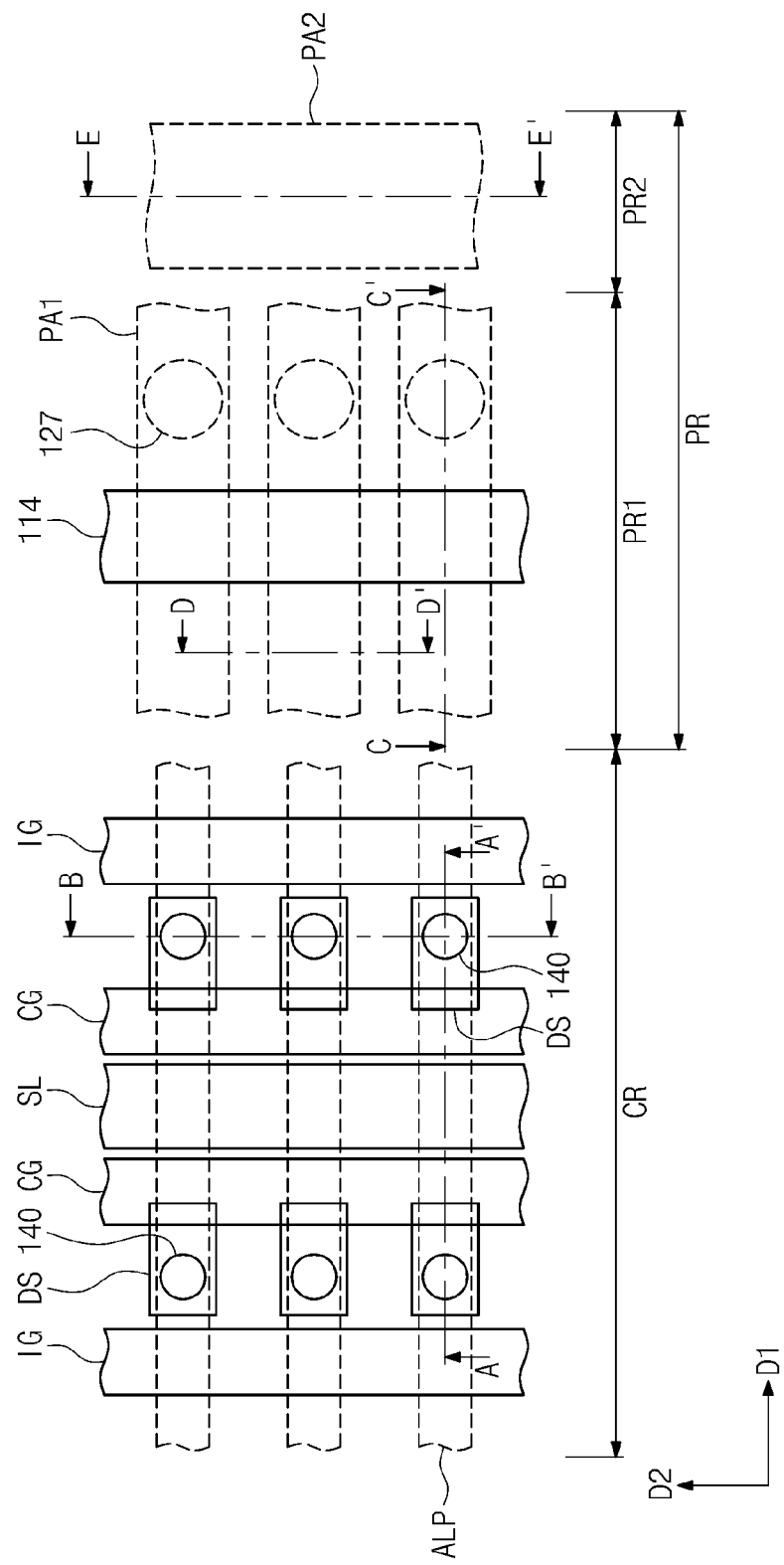
Figure 5B:
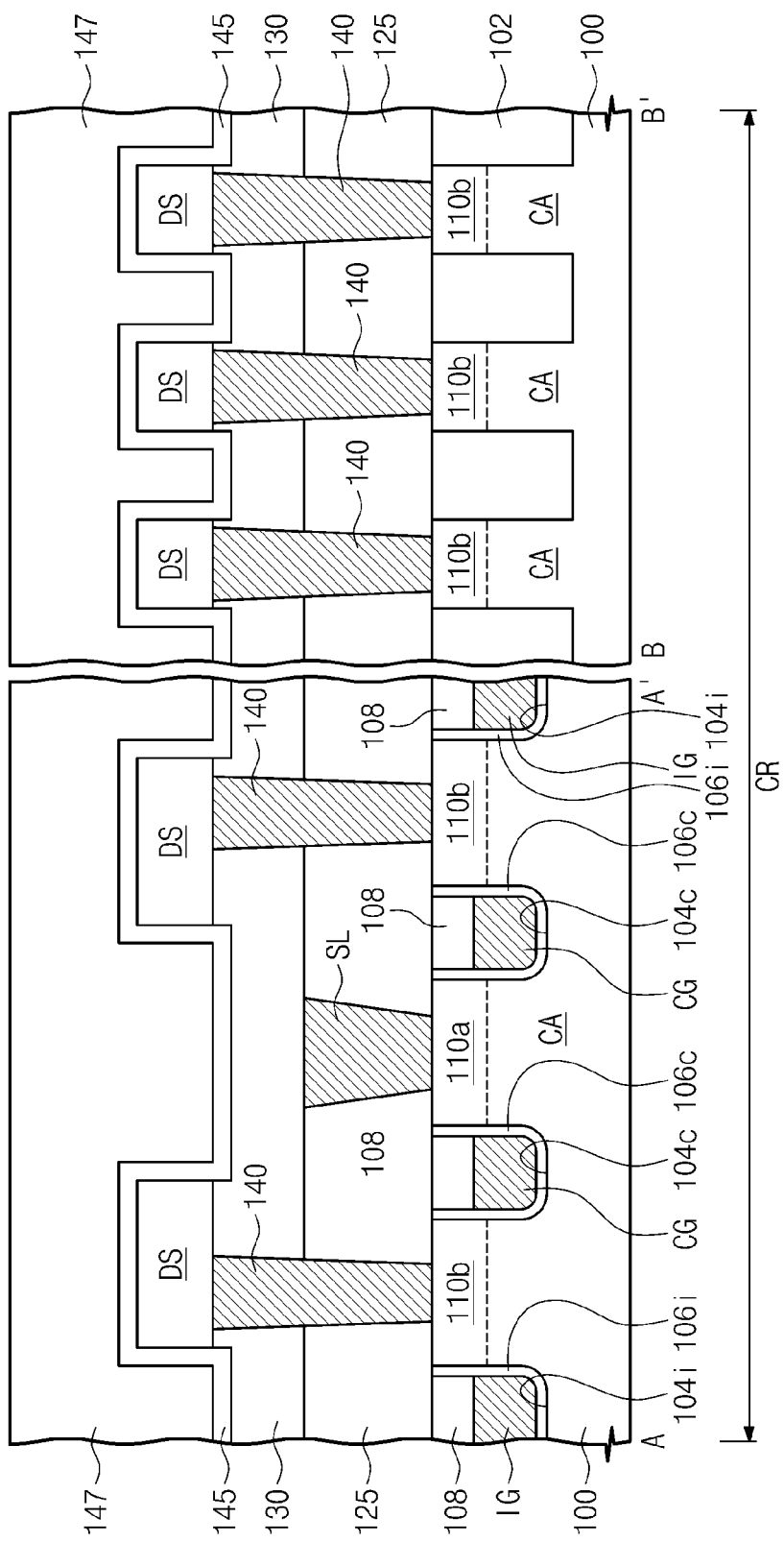
Figure 6A:
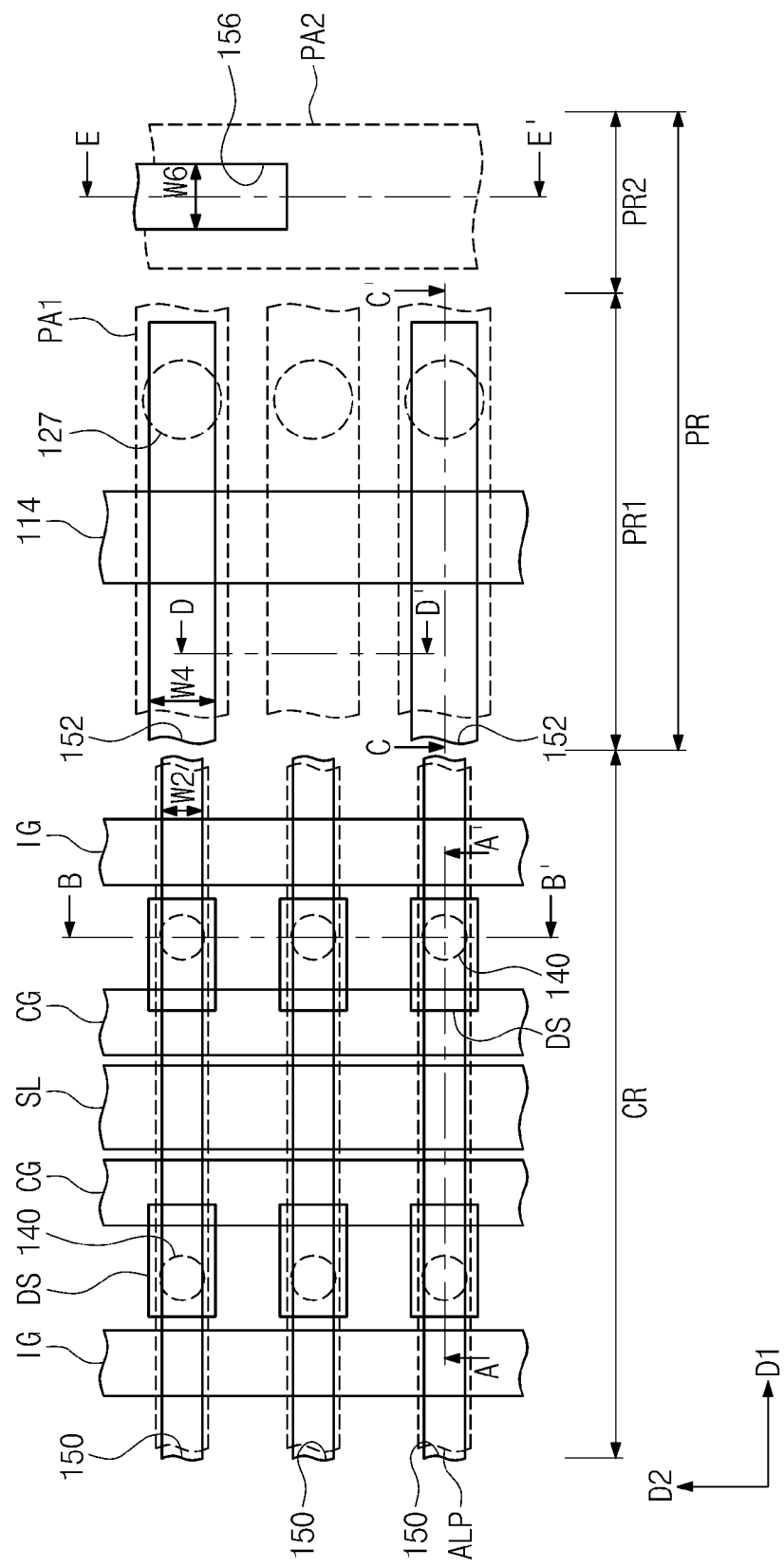
Figure 6B:
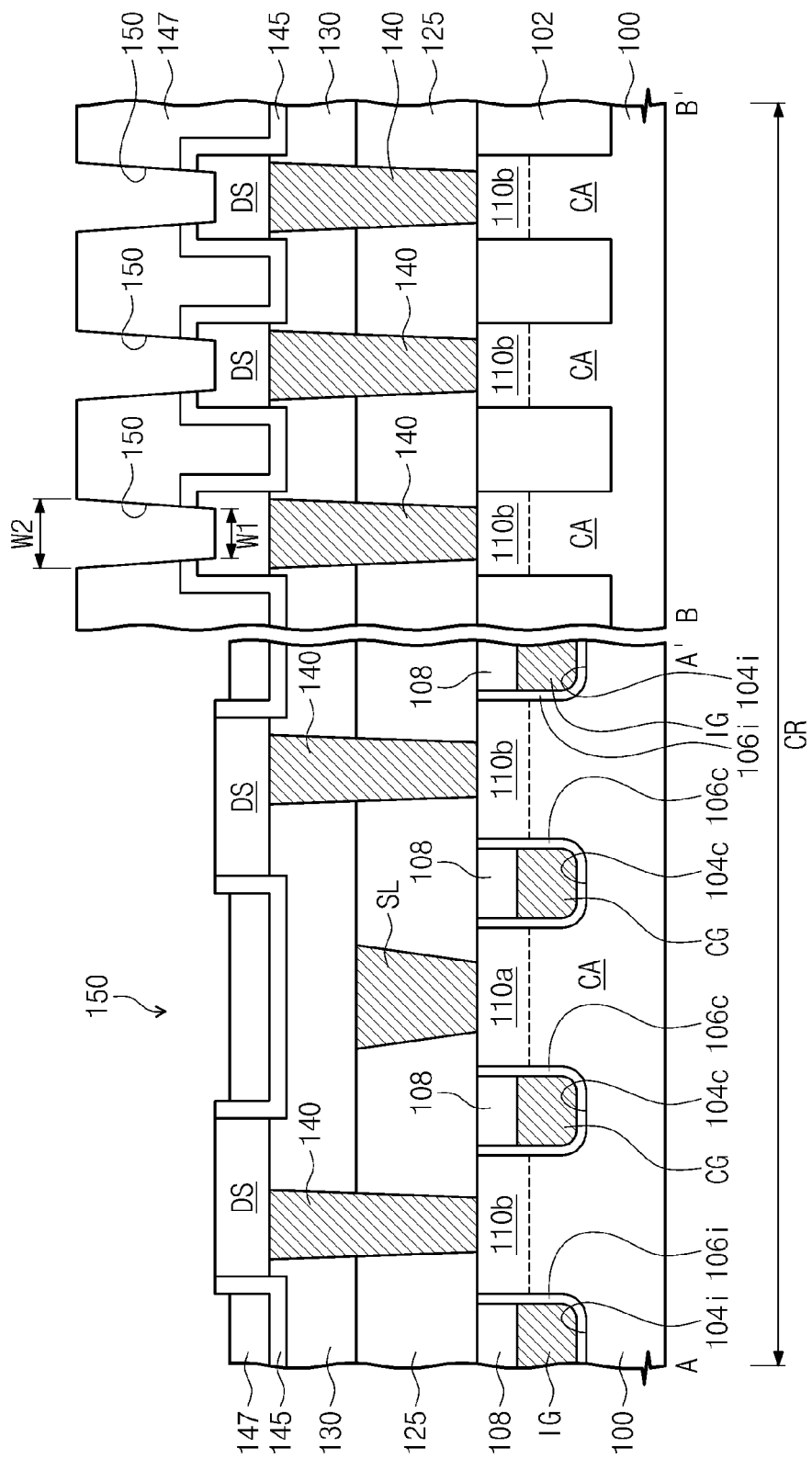
Figure 7A:
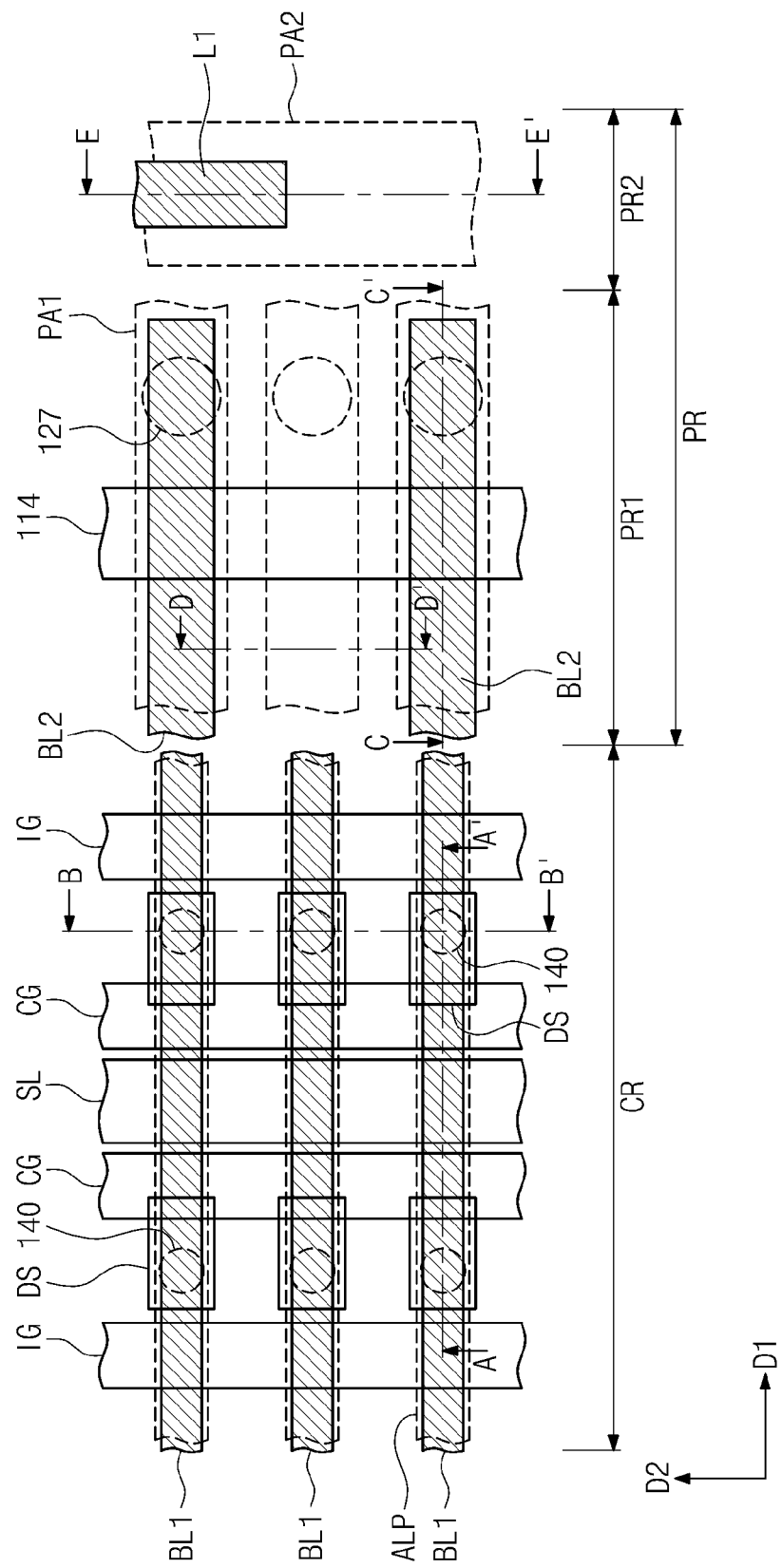
Figure 7B:
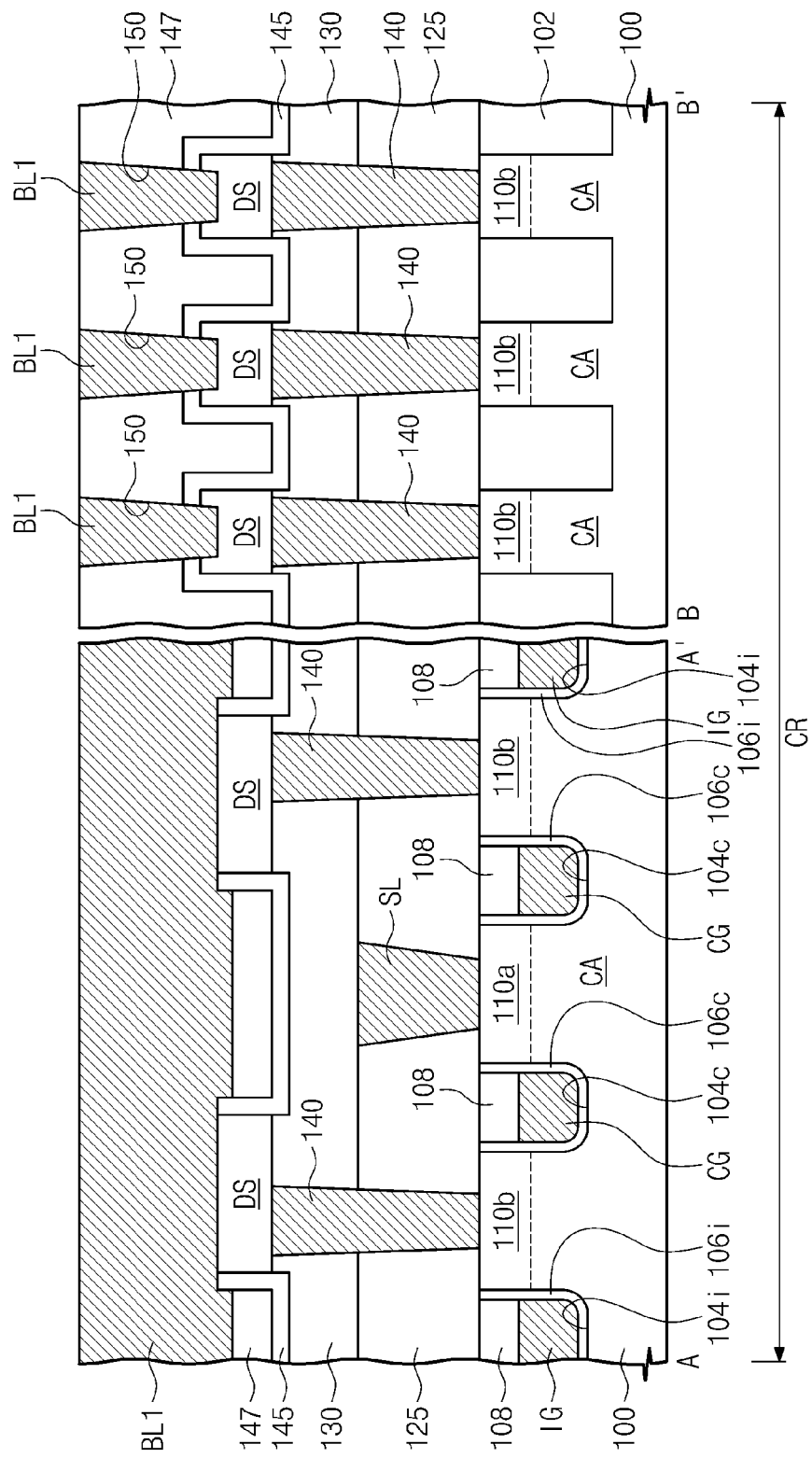
Figure 7C:
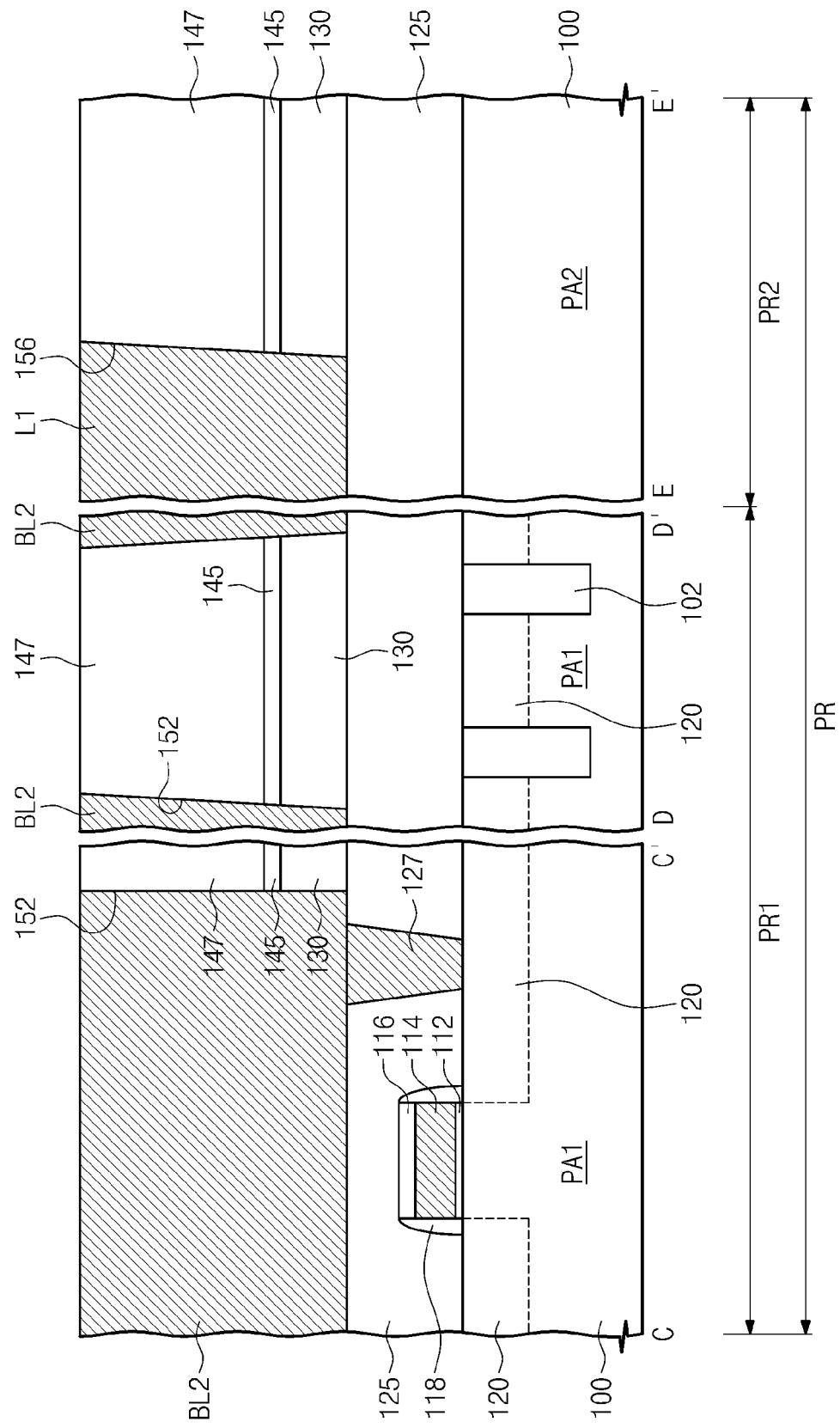
Figure 8A:
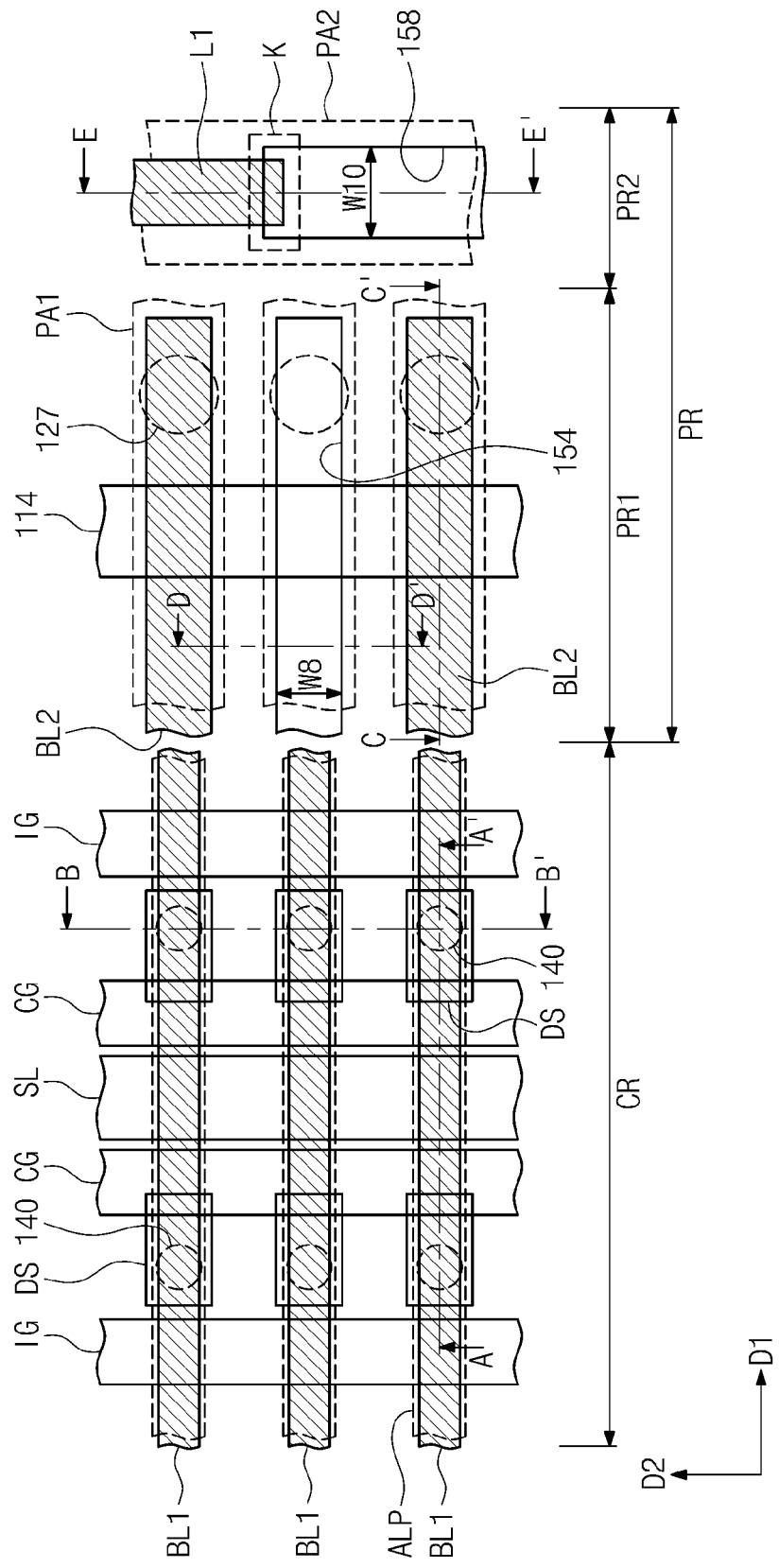
Figure 8B:
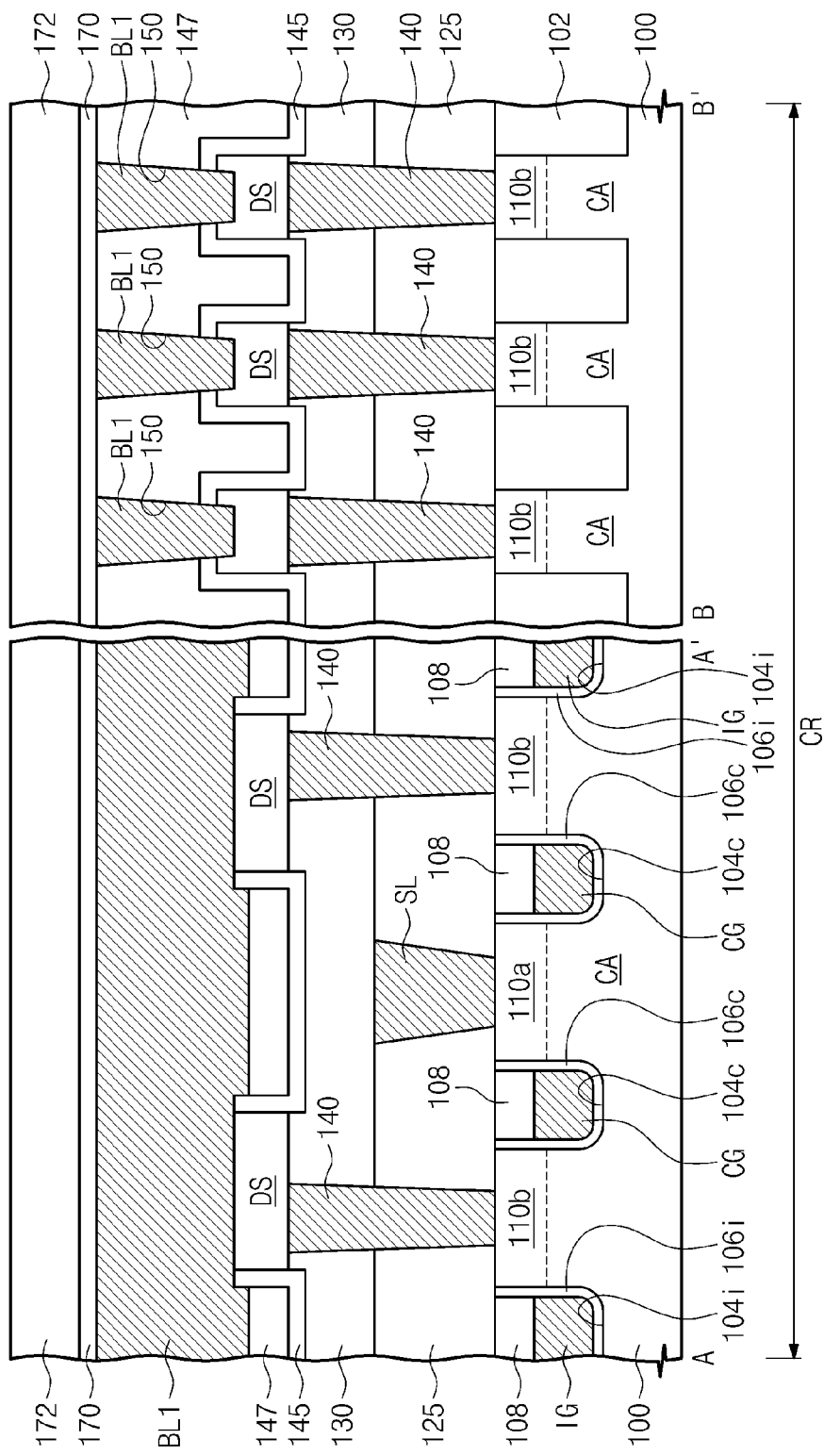
Figure 8C:
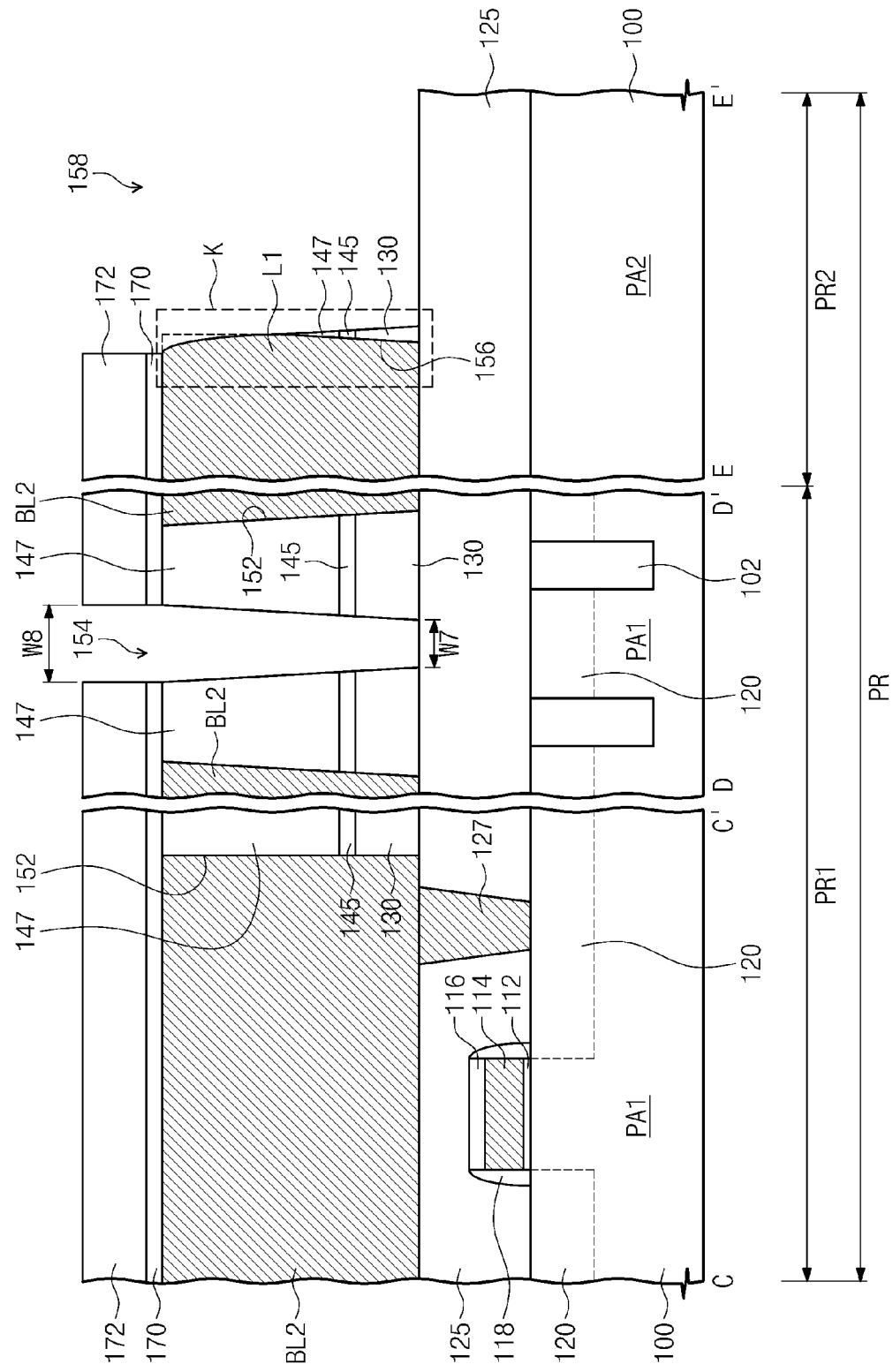
Figure 9A:
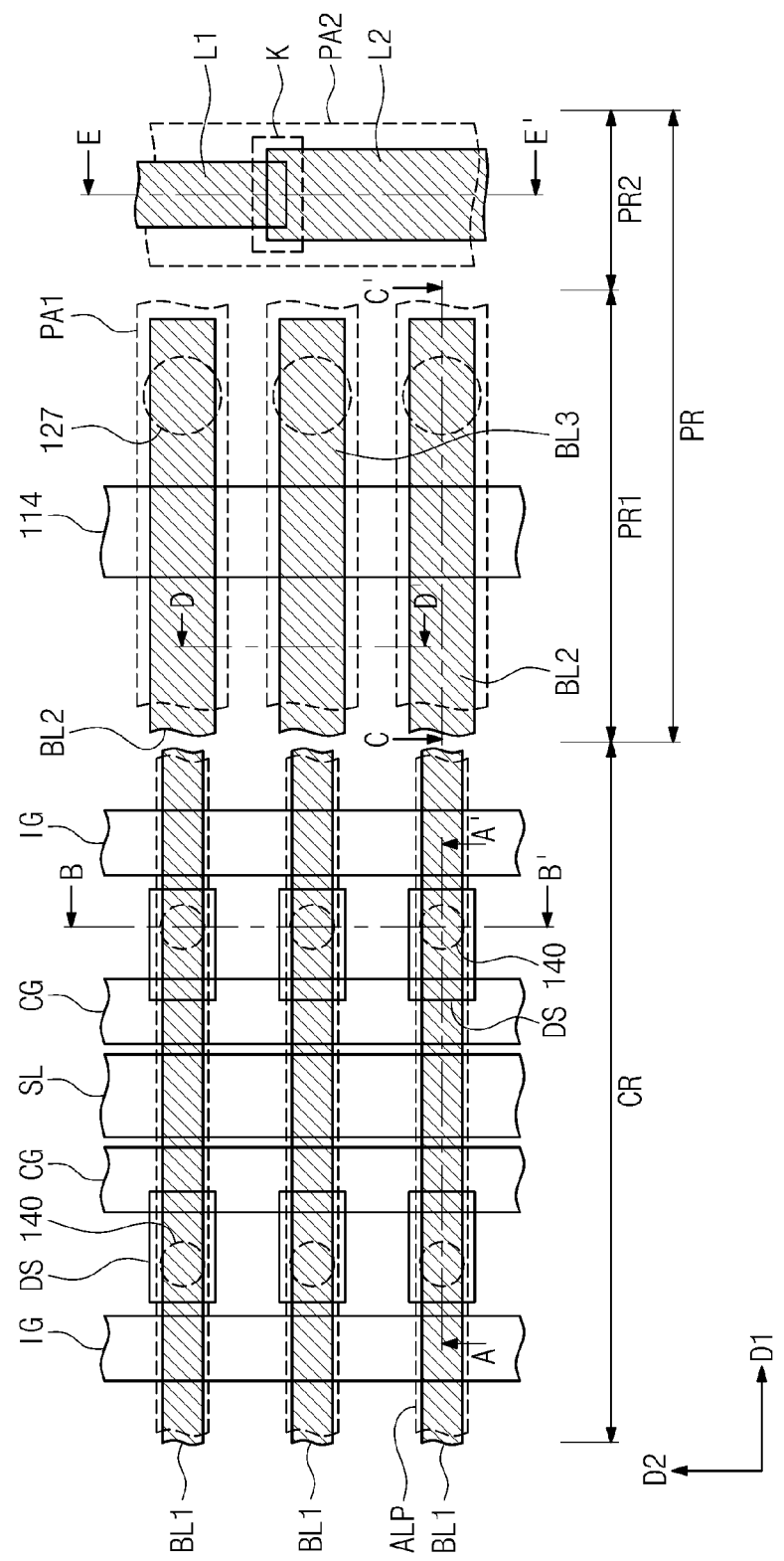
Figure 9B:
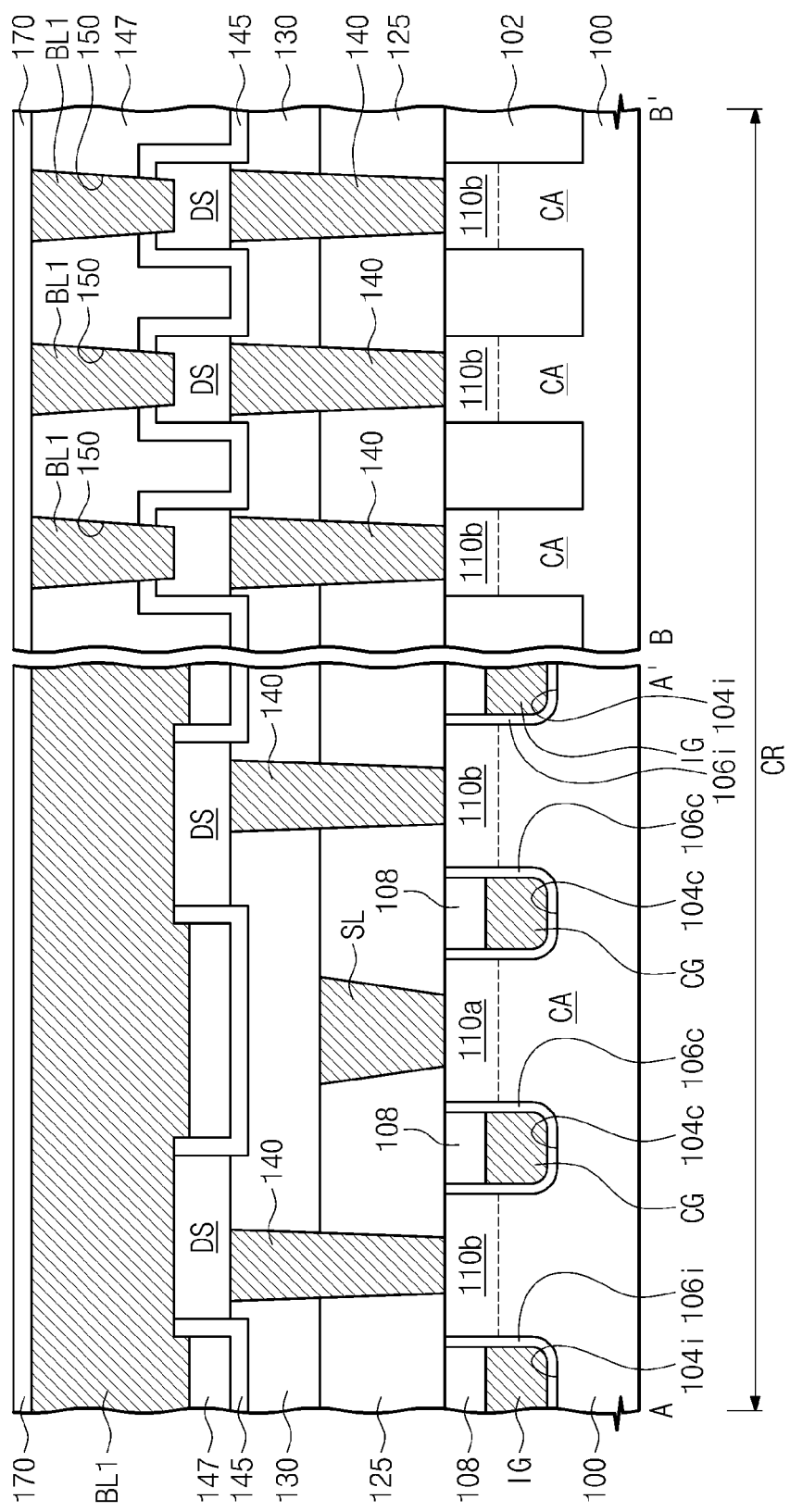
Figure 9C:
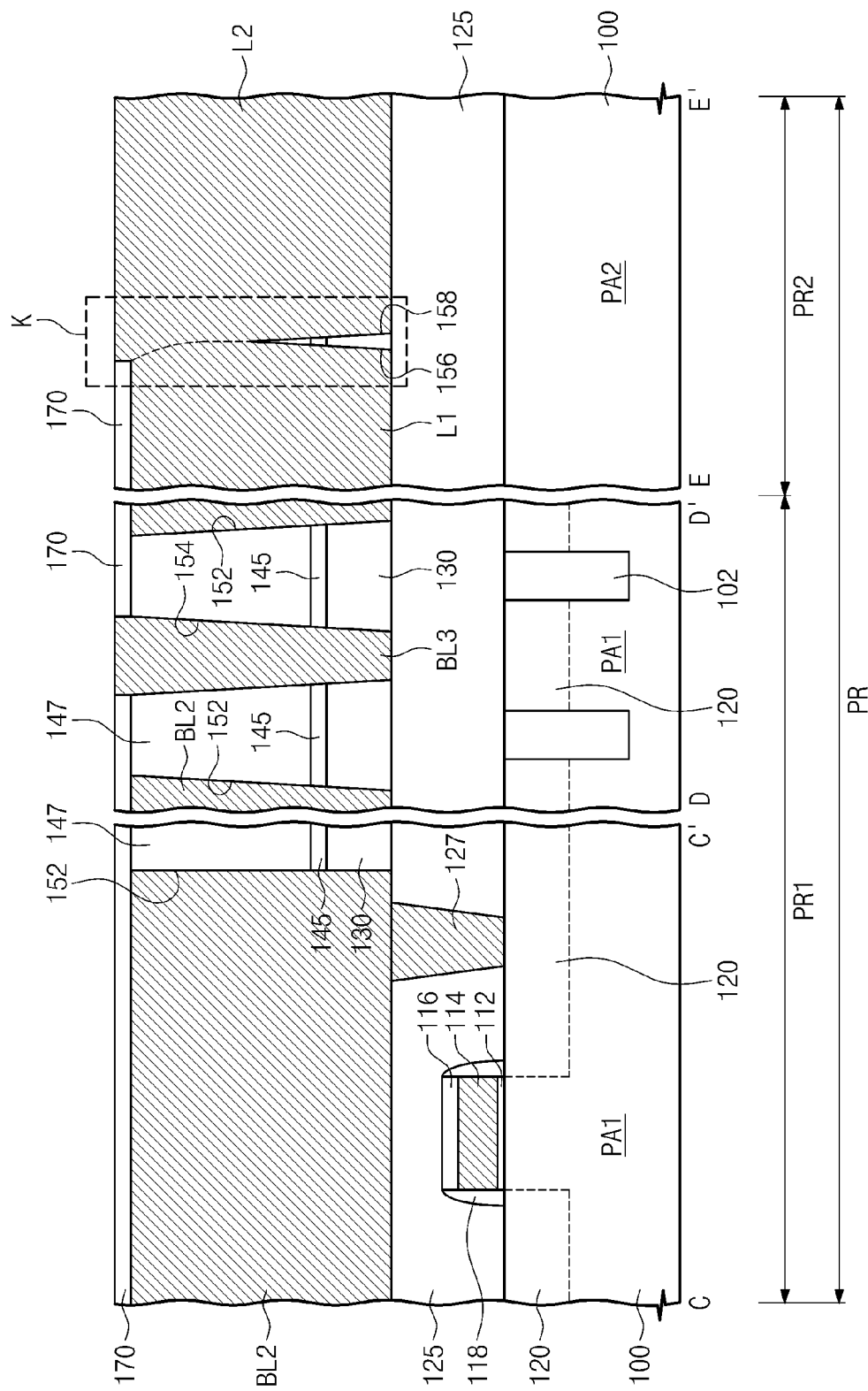

Referring to FIGS. 5A, 5B, and 5C, a data storage layer may be formed on the second interlayer dielectric layer 130. In some embodiments, the data storage layer may include a lower electrode layer, a magnetic tunnel junction layer, and an upper electrode layer that are sequentially stacked.

The data storage layer may be patterned to form data storage elements DS in the cell region CR. The data storage elements DS may be connected to respective ones of the contact plugs 140. The data storage elements DS may, for example, be configured as described with reference to FIG. 10. Alternatively, the data storage elements DS may, for example, be configured as described with reference to FIG. 11.

When the data storage layer is patterned, the second interlayer dielectric layer 130 may be recessed by overetching. At this time, due to a loading effect, the second interlayer dielectric layer 130 in the peripheral regions PR1 and PR2 may be recessed more than the second interlayer dielectric layer 130 around the data storage elements DS in the cell region CR. Thus, after the data storage elements are formed, a thickness of the second interlayer dielectric layer 130 in the peripheral regions PR1 and PR2 may be smaller than a minimum thickness of the second interlayer dielectric layer 130 in the cell region CR.

Subsequently, a third interlayer dielectric layer 145 may be formed on substantially an entire surface of the semiconductor substrate 100. The third interlayer dielectric layer 145 may be formed to cover top surfaces and sidewalls of the data storage elements DS. The third interlayer dielectric layer 145 may, for example, be formed using a chemical vapor deposition (CVD) process and/or an atomic layer deposition (ALD) process. A fourth interlayer dielectric layer 147 may be formed on the third interlayer dielectric layer 145. The fourth interlayer dielectric layer 147 in the cell region CR may fill a space between the data storage elements DS. The fourth interlayer dielectric layer 147 may, for example, be formed using a CVD process and/or an ALD process. The fourth interlayer dielectric layer 147 may be formed to include a top surface having substantially the same height in the cell and peripheral regions CR, and PR1 and PR2, respectively.

Referring to FIGS. 6A, 6B, 6C, and 12, during one step (S10), the interlayer dielectric layers 147 and 145 in the cell region CR may be patterned to form first trenches 150 exposing the data storage elements DS. The first trenches 150 may extend in the first direction D1. Each of the first trenches 150 may expose a plurality of data storage elements DS arranged along the first direction D1.

A width W1 of a lower portion of each of the first trenches 150 may be smaller than a width W2 of an upper portion of each of the first trenches 150. In other words, sidewalls of the first trenches 150 may be inclined. Top surfaces of the data storage elements DS exposed by the first trenches 150 may be recessed downward. A portion of a bottom surface of the first trench 150 may be recessed more than the recessed top surfaces of the data storage elements DS.

The interlayer dielectric layers 147, 145, and 130 in the first peripheral region PR1 may be successively patterned to form second trenches 152 exposing some of the peripheral plugs 127 during another step (S20). A width of a lower portion of each of the second trenches 152 may be smaller than a width W4 of an upper portion of each of the second trenches 152. In other words, sidewalls of the second trenches 152 may be inclined. The width W4 of the upper portion of the second trench 152 may be greater than the width W2 of the upper portion of the first trench 150. The second trenches 152 may have substantially linear shapes when viewed in plan view. According to some embodiments, each of the second trenches 152 may be connected to a corresponding one of the first trenches 150.

The interlayer dielectric layers 147, 145, and 130 in the second peripheral region PR2 may be successively patterned to form a first interconnection trench 156. A width of a lower portion of the first interconnection trench 156 may be smaller than a width W6 of an upper portion of the first interconnection trench 156. In other words, sidewalls of the first interconnection trench 156 may be inclined. The width W6 of the upper portion of the first interconnection trench 156 may be greater than the width W2 of the upper portion of the first trench 150. The first interconnection trench 156 may have a substantially linear shape when viewed in plan view and may be connected to one of the second trenches 152.

The second trenches 152 may be formed after the formation of the first trenches 150. Alternatively, the first trenches 150 may be formed after the formation of the second trenches 152. The first interconnection trench 156 may be formed substantially simultaneously with the second trenches 152.

Referring to FIGS. 7A, 7B, 7C, and 12, first bit lines BL1, second bit lines BL2, and a first interconnection L1 may be formed in the first trenches 150, the second trenches 152, and the first interconnection trench 156, respectively, during a further step (S30). The first bit lines BL1, the second bit lines BL2, and the first interconnection L1 may be formed at substantially the same time using a damascene process. More particularly, a conductive layer may be formed on the fourth interlayer dielectric layer 147 to fill the first trenches 150, the second trenches 152, and the first interconnection trench 156. Thereafter, the conductive layer may be planarized until the fourth interlayer dielectric layer 147 is exposed, thereby forming first bit lines BL1, the second bit lines BL2, and the first interconnection L1. The conductive layer may, for example, include copper (Cu).

Referring to FIGS. 8A, 8B, 8C, and 12, a first mask layer 170 and a second mask layer 172 may be sequentially formed on the fourth interlayer dielectric layer 147 to cover the first bit lines BL1, the second bit lines BL2, and the first interconnection L1. The first mask layer 170 may, for example, include silicon nitride (SiN), and the second mask layer 172 may include a carbon-containing oxide. The second mask layer 172 may be thicker than the first mask layer 170. The second and first mask layers 172 and 170, respectively, may be patterned to form openings in which third bit lines and a second interconnection are formed.

If the first and second mask layers 170 and 172, respectively, are formed to fill the trenches 150, 152, and 156 before the first and second bit lines BL1 and BL2, respectively, and the first interconnection L1 are formed to fill the trenches 150, 152, and 156, a height dispersion of top surfaces of the mask layers 170 and 172 may be caused. In particular, since the width (W4 of FIG. 6A) of the second trench 152 and the width (W6 of FIG. 6A) of the first interconnection trench 156 are greater than the width (W2 of FIG. 6A) of the first trench 150, the height dispersion of the top surfaces of the mask layers 170 and 172 in the peripheral regions PR1 and PR2 may be greater than the height dispersion of the top surfaces of the mask layers 170 and 172 in the cell region CR. Due to the dispersion of the top surfaces of the mask layers 170 and 172, a margin of a depth of focus (DOF) may be reduced an exposure process of the patterning process for forming the openings in the mask layers 170 and 172.

According to embodiments of the inventive concepts, the first bit lines BL, the second bit lines BL2, and the first interconnection L1 are formed in the first trenches 150, the second trenches 152, and the first interconnection trench 156, respectively. The first and second mask layers 170 and 172, respectively, may then be formed on substantially the entire surface of the semiconductor substrate 100. Since the first bit lines BL, the second bit lines BL2, and the first interconnection L1 fill the trenches, the top surfaces of the mask layers 170 and 172 in the cell and peripheral regions CR, and PR1 and PR2, respectively, may be disposed at substantially the same level. In other words, the top surfaces of the mask layers 170 and 172 may be substantially flat in the cell and peripheral regions CR, and PR1 and PR2, respectively. Thus, the DOF margin may be increased in the exposure process for patterning the mask layers 170 and 172.

The interlayer dielectric layers 147, 145, and 130 in the first peripheral region PR1 may be etched using the first and second mask layers 170 and 172, respectively, as etch masks, which have the openings formed therein. Third trenches 154 are thereby formed while exposing others of the peripheral plugs 127 in a process step (S40). The third trenches 154 may be formed between the second bit lines BL2. In other words, the second trenches 152 and the third trenches 154 may be alternately and repeated arranged in the second direction D2.

A width W7 of a lower portion of each of the third trenches 154 may be smaller than a width W8 of an upper portion of each of the third trenches 154. In other words, sidewalls of the third trenches 154 may be inclined. The width W8 of the upper portion of the third trench 154 may be greater than the width W2 of the upper portion of the first trench 150. The third trenches 154 may have substantially linear shapes when viewed in plan view. In some embodiments, each of the third trenches 154 may be connected to one of the first trenches 150.

The interlayer dielectric layers 147, 145, and 130 in the second peripheral region PR2 may be etched using the first and second mask layers 170 and 172, respectively, as etch masks (which have the openings formed therein), thereby forming a second interconnection trench 158 in the second peripheral region PR2. A width W10 of an upper portion of the second interconnection trench 158 may be greater than the width W2 of the upper portion of the first trench 150. The second interconnection trench 158 may have a substantially linear shape when viewed in plan view. The second interconnection trench 158 may be connected to one of the third trenches 154. In some embodiments, the second peripheral region PR2 may include an overlapping region K in which one end of the second interconnection trench 158 overlaps with one end of the first interconnection trench 156. In the overlapping region K, the first and second mask layers 170 and 172, respectively, may have an opening exposing one end of the first interconnection L1. An upper portion of the exposed end of the first interconnection L1 may be partially etched in the overlapping region K during the etching process of forming the second interconnection trench 158. Additionally, if the first interconnection L1 has inclined sidewalls, portions of the interlayer dielectric layers 130, 145, and 147 may not be etched but may remain on a lower sidewall of the exposed end of the first interconnection L1 in the overlapping region K during the etching process. The second interconnection trench 158 and the third trenches 154 may be formed at substantially the same time.

If the second interconnection trench 158 is formed before the formation of the first interconnection L1 disposed in the first interconnection trench 156, a bottom surface of one end of the first interconnection trench 156 may be over-etched in the overlapping region K during the etching process of the second interconnection trench 158. Thus, a process margin may be reduced.

According to embodiments of the inventive concepts, when the first interconnection L1 fills the first interconnection trench 156 before the formation of the second interconnection trench 158, it is possible to prevent the bottom surface of the one end of the first interconnection trench 156 from being over-etched in the overlapping region K during the etching process of the second interconnection trench 158. Thus, a process margin may be increased.

Referring to FIGS. 9A, 9B, 9C, and 12, the second mask layer 172 may be removed first. The second mask layer 172 may be removed, for example, by a strip process using an ashing process and phosphoric acid. Next, third bit lines BL3 and a second interconnection L2 may be formed in the third trenches 154 and the second interconnection trench 158, respectively during a process step (S50). The third bit lines BL3 and the second interconnection L2 may be formed at substantially the same time using a damascene process. More particularly, a conductive layer may be formed on the first mask layer 170 to fill the third trenches 154 and the second interconnection trench 158, and a planarization process may then be performed on the conductive layer until the mask layer 170 is exposed, thereby forming the third bit lines BL3 and the second interconnection L2. The conductive layer may, for example, include copper (Cu). The first mask layer 170 may be used as a planarizing stop layer in the planarization process, so that top surfaces of the third bit lines BL3 and the second interconnection L2 may be higher than the top surfaces of the first and second bit lines BL1 and BL2, respectively, and the first interconnection L1.

According to embodiments of the inventive concepts, a height of the top surface of the second interconnection L2 may be higher than a height of the top surface of the first interconnection L1. Thus, even though the remaining layers exist on the lower sidewall of one end of the first interconnection L1 in the overlapping region K (in which one end of the first interconnection L1 overlaps with one end of the second interconnection L2), it is possible to reduce a phenomenon wherein the second interconnection L2 is separated from the first interconnection L1 by the remaining layers.

Thereafter, the first mask layer 170 may be removed. The first mask layer 170 may be removed, for example, using a dry-etching process.

Referring again to FIGS. 1A, 1B, and 1C, a first layer 160 and a second layer 165 may be sequentially formed on the semiconductor substrate 100. The first and second layers 160 and 165, respectively, may cover the bit lines BL1, BL2, and BL3 and the interconnections L1 and L2. The first layer 160 may, for example, include silicon nitride and the second layer 165 may include an oxide, a nitride, and/or an oxynitride.

As data storage devices have become more highly integrated, it is increasingly difficult to form the second trenches 152 and the third trenches 154 alternately arranged in a same layer of the first peripheral region PR1 at the same time. Thus, the second trenches 152 may first be formed in the desired layer, a mask layer may be formed on the layer having the second trenches 152, and the third trenches 154 may then be formed in the same layer using openings formed in the mask layer. In this case, a height dispersion of a top surface of the mask layer on the desired layer may be caused by the shapes of the second trenches 152. A DOF margin may be reduced in an exposure process for forming the openings of the mask layer due to the height dispersion of the top surface of the mask layer.

The first interconnection trench 156 of the second peripheral region PR2 may be formed substantially simultaneously with the second trenches 152. And the second interconnection trench 158 of the second peripheral region PR2 may be formed substantially simultaneously with the third trenches 154. Thus, for the reasons described above, a DOF margin may be reduced in the exposure process performed on the mask layer for forming the second interconnection trench 158. Additionally, over-etching may be caused in the overlapping region K of the first and second interconnection trenches 156 and 158, respectively, during the etching process for forming the second interconnection trench 158. Thus, a process margin may be reduced.

According to embodiments of the inventive concepts, the damascene process used for forming the first bit lines BL1, the second bit lines BL2, and the first interconnection L1 may be separated from (or performed independently of) the damascene process for forming the third bit lines BL3 and the second interconnection L2. In other words, after the first bit lines BL1, the second bit lines BL2, and the first interconnection L1 are formed in the first trenches 150, the second trenches 152, and the first interconnection trench 156, respectively, the third trenches 154 and the second interconnection trench 158 may be formed using the mask layers 170 and 172 having the openings formed therein. In this case, since the second trenches 152 and the first interconnection trench 156 are filled with the second bit lines BL2 and the first interconnection L1, respectively, heights of the top surfaces of the mask layers 170 and 172 thereon may be substantially uniform. In other words, the top surfaces of the mask layers 170 and 172 may be substantially flat. Thus, the DOF margin of the exposure process performed for forming the openings in mask layers 170 and 172 may be increased. Additionally, over-etching in the overlapping region K of the first and second interconnection trenches 156 and 158, respectively, may be substantially prevented during the etching process for forming the second interconnection trench 158, so that the process margin may be increased.

Figure 13:
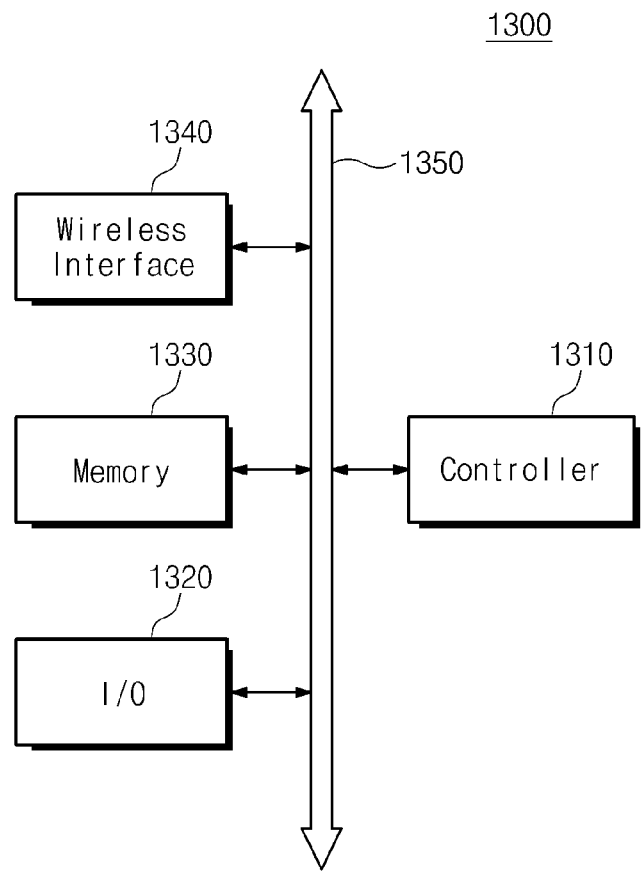
FIGS. 13 and 14 are schematic block diagrams illustrating electronic devices that may include data storage devices constructed according to embodiments of the inventive concepts.
Figure 14:
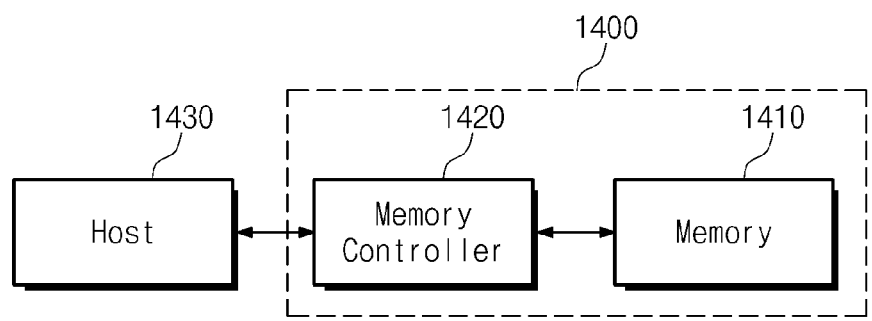

FIGS. 13 and 14 are schematic block diagrams illustrating electronic devices that may include data storage devices constructed according to embodiments of the inventive concepts.

Referring to FIG. 13, an electronic device 1300 including a data storage device according to embodiments of the inventive concepts may, for example, be a personal digital assistant (PDA), a laptop computer, a portable computer, a web tablet, a wireless phone, a mobile phone, a digital music player, a cable/wireless electronic device, or a composite electronic device including two or more of the foregoing devices. The electronic device 1300 may include a controller 1310, an input/output (I/O) unit 1320 (e.g., a keypad, a keyboard, or a display), a memory device 1330, and a wireless interface unit 1340 that are coupled to each other through a data bus 1350. For example, the controller 1310 may include at least one of a microprocessor, a digital signal processor, a microcontroller, or another logic device having a function similar to any one or more of these devices. The memory device 1330 may store, for example, commands executed through the controller 1310. Additionally, the memory device 1330 may store user's data. The memory device 1330 may include at least one of the data storage devices in the aforementioned embodiments of the inventive concepts. The electronic device 1300 may use the wireless interface unit 1340 to transmit data to or receive data from a wireless communication network using a radio frequency (RF) signal. For example, the wireless interface unit 1340 may include an antenna or a wireless transceiver. The electronic device 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, and MMDS, for example.

Referring to FIG. 14, data storage devices according to embodiments of the inventive concepts may be used in memory systems. A memory system 1400 may, for example, include a memory device 1410 and a memory controller 1420 for storing massive data. The memory controller 1420 may control the memory device 1410 in order to read data from or write data into the memory device 1410 in response to a read/write request of a host 1430. The memory controller 1420 may make an address mapping table for mapping an address provided from the host 1430 (e.g., a mobile device or a computer system) into a physical address of the memory device 1410. The memory device 1410 may include at least one of the data storage devices constructed according to the above embodiments of the inventive concepts.

A package in which a data storage device according to one of the above embodiments is mounted may further include a controller and/or a logic device for controlling the data storage device.

According to embodiments of the inventive concepts, first bit lines and second bit lines may be alternately and repeatedly arranged in the peripheral region. The first bit lines may be formed using a first damascene process, and the second bit lines may be formed using a second damascene process different from the first damascene process. Thus, the DOF margin may be increased in the exposure process for forming trenches in which the second bit lines will be formed, after the first bit lines have been formed. Additionally, in the peripheral region, the first interconnection formed substantially simultaneously with the first bit lines may overlap with the second interconnection formed substantially simultaneously with the second bit lines. Since the first interconnection and the second interconnection may be formed by the different first and second damascene processes, over-etching may be prevented in the overlapping region of the first and second interconnections. Thus, the process margin may be increased.

While the inventive concepts have been described with reference to example embodiments, it will be apparent to those skilled in the art that various changes and modifications may be made thereto without departing from the spirit and scope of those inventive concepts. Therefore, it should be understood that the above embodiments are not limiting, but are merely illustrative of those inventive concepts. Thus, the following claims are to be given the broadest permissible interpretation including their equivalents, and should not be unduly restricted or limited by the foregoing description.

What is claimed is:

1. A method for manufacturing a data storage device, the method comprising:
   forming an interlayer dielectric layer on a substrate;
   patterning the interlayer dielectric layer in a peripheral region of the substrate to form first trenches;
   forming first bit lines in the first trenches;
   after forming the first bit lines, patterning the interlayer dielectric layer between the first bit lines in the peripheral region to form second trenches extending along the first trenches; and
   forming second bit lines in the second trenches,
   wherein bottom surfaces of the second bit lines are formed to be disposed at height that is substantially the same as a height of bottom surfaces of the first bit lines.

2. The method of claim 1, wherein the first trenches and the second trenches are alternately and repeatedly arranged.

3. The method of claim 1, wherein top surfaces of the second bit lines are formed to be higher than top surfaces of the first bit lines.

4. The method of claim 1, wherein the first bit lines and the second bit lines include the same material.

5. The method of claim 1, further comprising:
   etching the interlayer dielectric layer in the peripheral region to form a first interconnection trench; and
   forming a first interconnection in the first interconnection trench,
   wherein the first interconnection trench is formed substantially simultaneously with the first trenches, and the first interconnection is formed substantially simultaneously with the first bit lines.

6. The method of claim 5, wherein top surfaces of the second bit lines are formed to be higher than a top surface of the first interconnection.

7. The method of claim 5, wherein a top surface of the first interconnection has a height that is substantially the same as a height of top surfaces of the first bit lines, and wherein a bottom surface of the first interconnection has a height that is substantially the same as a height of bottom surfaces of the first bit lines.

8. The method of claim 5, further comprising:

forming data storage parts arranged two-dimensionally in plan view in a cell region of the substrate, the interlayer dielectric layer covering the data storage parts;

patterning the interlayer dielectric layer in the cell region to form third trenches exposing the data storage parts; and forming third bit lines in the third trenches, wherein the third bit lines are formed substantially simultaneously with the first bit lines.

9. The method of claim 8, wherein a width of each of the third bit lines is smaller than a width of each of the first bit lines and a width of each of the second bit lines.

10. The method of claim 8, wherein forming the first bit lines, the third bit lines, and the first interconnection comprises:

forming a conductive layer filling the first trenches, the third trenches, and the first interconnection trench; and planarizing the conductive layer until the interlayer dielectric layer is exposed.

11. The method of claim 5, further comprising:

etching the interlayer dielectric layer in the peripheral region to form a second interconnection trench; and forming a second interconnection in the second interconnection trench, wherein the second interconnection trench is formed substantially simultaneously with the second trenches, and the second interconnection is formed substantially simultaneously with the second bit lines.

12. The method of claim 11, wherein a top surface of the second interconnection is formed to be higher than a top surface of the first interconnection.

13. The method of claim 11, wherein a bottom surface of the second interconnection has a height that is substantially the same as a height of a bottom surface of the first interconnection.

14. The method of claim 11, wherein forming the second trenches and the second interconnection trench comprises:

sequentially forming a first mask layer and a second mask layer on the interlayer dielectric layer, the first bit lines, and the first interconnection;

patterning the second and first mask layers to form openings defining the second trenches and the second interconnection trench;

etching the interlayer dielectric layer using the second and first mask layers having the openings formed therein as etch masks; and removing the second mask layer.

15. The method of claim 14, wherein forming the second bit lines and the second interconnection comprises:

forming a conductive layer filling the second trenches and the second interconnection trench;

planarizing the conductive layer until the first mask layer is exposed; and removing the first mask layer.

16. A method for manufacturing a data storage device, the method comprising:

forming an interlayer dielectric layer on a substrate;

patterning the interlayer dielectric layer in a peripheral region of the substrate to form first trenches;

forming first bit lines in the first trenches;

after forming the first bit lines, patterning the interlayer dielectric layer between the first bit lines in the peripheral region to form second trenches extending along the first trenches;

forming second bit lines in the second trenches;

etching the interlayer dielectric layer in the peripheral region to form a first interconnection trench; and forming a first interconnection in the first interconnection trench, wherein the first interconnection trench is formed substantially simultaneously with the first trenches, and the first interconnection is formed substantially simultaneously with the first bit lines.

17. The method of claim 16, wherein top surfaces of the second bit lines are formed to be higher than a top surface of the first interconnection.

18. The method of claim 16, wherein a top surface of the first interconnection has a height that is substantially the same as a height of top surfaces of the first bit lines, and wherein a bottom surface of the first interconnection has a height that is substantially the same as a height of bottom surfaces of the first bit lines.

19. A method for manufacturing a data storage device, the method comprising:

forming an interlayer dielectric layer on a substrate;

forming first trenches in the interlayer dielectric layer in a cell region of the substrate;

forming second trenches in the interlayer dielectric layer in a peripheral region of the substrate;

forming first bit lines in the first trenches using a first damascene process; and forming second bit lines in the second trenches using a second damascene process that is separate from the first damascene process, wherein bottom surfaces of the second bit lines are formed to be disposed at height that is lower than a height of bottom surfaces of the first bit lines, and wherein top surfaces of the second bit lines are formed to be higher than top surfaces of the first bit lines.

20. The method of claim 19, further comprising:

forming third trenches in the interlayer dielectric layer between the second bit lines in the peripheral region; and forming third bit lines in the third trenches.

* * * * *